(12) United States Patent
Jung et al.

(10) Patent No.: US 12,230,625 B2
(45) Date of Patent: Feb. 18, 2025

(54) INTEGRATED CIRCUIT INCLUDING STANDARD CELL AND FILLER CELL

(71) Applicant: Samsung Electronics Co., Ltd., Suwon-si (KR)

(72) Inventors: Hakchul Jung, Seoul (KR); Ingyum Kim, Bucheon-si (KR); Giyoung Yang, Seoul (KR); Jaewoo Seo, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/591,089

(22) Filed: Feb. 29, 2024

(65) Prior Publication Data

US 2024/0203973 A1    Jun. 20, 2024

Related U.S. Application Data

(63) Continuation of application No. 17/528,242, filed on Nov. 17, 2021, now Pat. No. 11,948,932.

(30) Foreign Application Priority Data

Mar. 26, 2021   (KR) .................. 10-2021-0039840

(51) Int. Cl.
  *H01L 27/02*   (2006.01)
  *H01L 29/06*   (2006.01)
  *H01L 29/423*  (2006.01)
  *H01L 29/786*  (2006.01)

(52) U.S. Cl.
  CPC ...... *H01L 27/0207* (2013.01); *H01L 29/0665* (2013.01); *H01L 29/42392* (2013.01); *H01L 29/78696* (2013.01)

(58) Field of Classification Search
  CPC .......... H01L 27/0207; H01L 29/42392; H01L 29/78696; H01L 2027/11874; H01L 27/11807
  See application file for complete search history.

(56) References Cited

U.S. PATENT DOCUMENTS

| | | |
|---|---|---|
| 7,302,651 B2 | 11/2007 | Allen et al. |
| 7,321,139 B2 | 1/2008 | Chang et al. |
| 7,538,368 B2 | 5/2009 | Yano |
| 7,895,548 B2 | 2/2011 | Lin et al. |
| 7,979,829 B2 | 7/2011 | Smayling |
| 8,069,430 B2 | 11/2011 | Moroz et al. |
| 8,214,774 B2 | 7/2012 | Nardone et al. |
| 9,070,551 B2 | 6/2015 | Bowers et al. |
| 9,514,260 B2 | 12/2016 | Kim |
| 9,659,130 B2 | 5/2017 | Kim et al. |
| 10,134,838 B2 | 11/2018 | Kang et al. |

(Continued)

*Primary Examiner* — Shih Tsun A Chou
(74) *Attorney, Agent, or Firm* — Muir Patent Law, PLLC

(57) ABSTRACT

An integrated circuit includes a standard cell including a first active region extending in a first direction and having a first width, and a filler cell including a second active region of a same type as that of the first active region and being adjacent to the standard cell in the first direction, the second active region extending in the first direction and having a second width which is greater than the first width, wherein the standard cell further includes a first tapering portion of the same type as that of the first active region, the first tapering portion being arranged between the first active region and the second active region.

20 Claims, 19 Drawing Sheets

(56) References Cited

U.S. PATENT DOCUMENTS

| | | |
|---|---|---|
| 10,276,554 B1 | 4/2019 | Chen et al. |
| 10,283,496 B2 | 5/2019 | Lo et al. |
| 2007/0111405 A1 | 5/2007 | Watanabe et al. |
| 2015/0161314 A1* | 6/2015 | Kim .................. G06F 30/39 |
| | | 716/102 |

* cited by examiner

INTEGRATED CIRCUIT INCLUDING STANDARD CELL AND FILLER CELL

CROSS-REFERENCE TO RELATED APPLICATION

This application is a continuation of U.S. application Ser. No. 17/528,242, filed Nov. 17, 2021, which is claims priority under 35 U.S.C. § 119 to Korean Patent Application No. 10-2021-0039840, filed on Mar. 26, 2021, in the Korean Intellectual Property Office, the entire contents of both of which are incorporated by reference.

BACKGROUND

The inventive concept relates to an integrated circuit, and more particularly, to an integrated circuit including a standard cell having a tapering portion and a filler cell.

It is known that reducing the size of a semiconductor device can improve the price competitiveness of the semiconductor device. However, the reduction in size of the semiconductor device may cause a short channel effect. To overcome the short channel effect, a fin field effect transistor (FinFET) in which a gate surrounds three sides of a channel has been developed, and a gate-all-round (GAA) transistor in which a gate surrounds four sides of a channel has been developed.

In addition, as the demand for miniaturized semiconductor devices gradually increases, demands on characteristics of the semiconductor devices are gradually increasing. For example, a demand for high-speed, multi-function, or the like for the semiconductor devices is increasing. In particular, as the demand for reliability of the miniaturized semiconductors devices increases, there is a need for a layout design capable for improving electrical characteristics of semiconductor devices and securing the reliability of the miniaturized semiconductor devices.

SUMMARY

The inventive concept relates to an integrated circuit, and provides an integrated circuit including a standard cell having a tapering portion and/or a reverse tapering portion, and a design method thereof.

According to an aspect of the inventive concept, there is provided an integrated circuit including a standard cell including a first active region extending in a first direction and having a first width, and a filler cell including a second active region of a same type as that of the first active region and being adjacent to the standard cell in the first direction, the second active region extending in the first direction and having a second width which is greater than the first width, wherein the standard cell further includes a first tapering portion of the same type as that of the first active region, the first tapering portion being arranged between the first active region and the second active region and including a first contact surface contacting the first active region in the first direction, a second contact surface contacting the second active region in the first direction, and an inclination surface connecting the first contact surface to the second contact surface and having an inclination.

According to another aspect of the inventive concept, there is provided an integrated circuit including a standard cell including a first active region extending in a first direction and having a first width, and a filler cell including a second active region of a same type as that of the first active region and being adjacent to the standard cell in the first direction, the second active region extending in the first direction and having a second width which is less than the first width, wherein the standard cell further includes a first tapering portion of the same type as that of the first active region, the first tapering portion being arranged between the first active region and the second active region and including a first contact surface contacting the first active region in the first direction, a second contact surface contacting the second active region in the first direction, and an inclination surface connecting the first contact surface to the second contact surface and having an inclination.

According to another aspect of the inventive concept, there is provided an integrated circuit including a plurality of standard cells spaced apart from each other in a first direction, and a plurality of filler cells arranged between the plurality of standard cells, wherein at least one of the plurality of filler cells includes a first active region extending in the first direction and having the first width, and a second active region of a different type from that of the first active region, the second active region being spaced apart from the first active region in a second direction perpendicular to the first direction and extending in the first direction, wherein at least one of the plurality of standard cells includes a third active region of a same type as that of the first active region, the third active region being adjacent to the first active region in the first direction, extending in the first direction, and having a second width which is less than the first width, a fourth active region of a same type as that of the second active region, the fourth active region being spaced apart from the third active region in the second direction and extending in the first direction, and a first tapering portion of the same type as that of the first active region, the first tapering portion comprising a first contact surface contacting the first active region in the first direction, a second contact surface contacting the third active region in the first direction, and an inclination surface connecting the first contact surface to the second contact surface and having an inclination.

BRIEF DESCRIPTION OF THE DRAWINGS

Embodiments of the inventive concept will be more clearly understood from the following detailed description taken in conjunction with the accompanying drawings in which like numeral refer to like elements throughout. In the drawings.

DETAILED DESCRIPTION OF THE EMBODIMENTS

Figure 1:
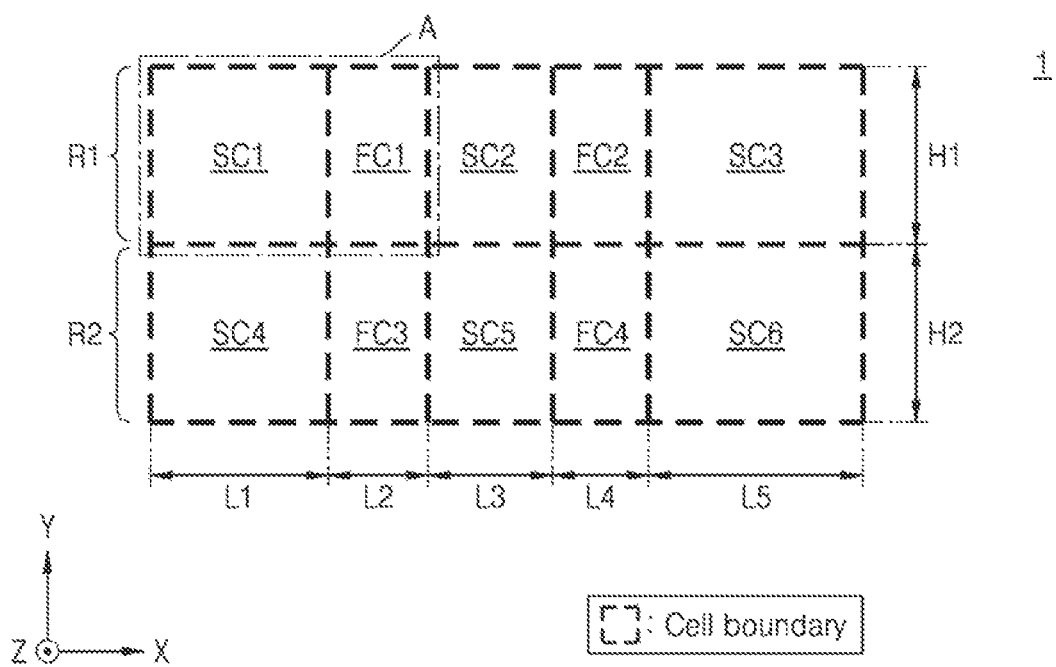
FIG. 1 is a schematic diagram of an integrated circuit (IC), according to an example embodiment of the inventive concept.

Hereinafter, various embodiments of the inventive concept will be described below with reference to the accompanying drawings. Hereinafter, on a plane of a layout diagram, a horizontal direction is defined as a first direction X, a vertical direction is defined as a second direction Y, and a direction substantially perpendicular to the layout diagram is defined as a third direction Z. Accordingly, the second direction Y may mean a direction perpendicular to the first direction X. A direction indicated by an arrow in the drawing and an opposite direction thereof will be described as the same direction. The above-described definition of directions is the same in all drawings hereinafter. In the drawings, only a portion may be shown for convenience of illustration.

FIG. 1 is a schematic diagram of an integrated circuit (IC) 1, according to an example embodiment of the inventive concept.

Referring to FIG. 1, the IC 1 may include first to sixth standard cells SC1 to SC6. A standard cell is a unit of layout included in an IC, and may be simply referred to as a cell in the inventive concept. The standard cell may be a functional cell or a logic cell that provides a Boolean logic function or a storage function. For example, the logic cell may be a NAND, AND, NOR, OR, XOR, inverter, adder, flip-flop, or latch. An IC may include a number of different standard cells. The standard cells may have a structure conforming to predetermined specifications, and may be arranged in a plurality of rows. For example, the first to third standard cells SC1 to SC3 may be arranged in a first row R1, and the fourths to sixth standard cells SC4 to SC6 may be arranged in a second row R2.

The IC 1 may include first to fourth filler cells FC1 to FC4. A filler cell may be a kind of dummy area between standard cells. The filler cell may fill a space between the standard cells to equalize an operation density in a layout design of a circuit block. In addition, the filler cell may be inserted between the standard cells to maintain the continuity of a well formed in the standard cells. For example, the first filler cell FC1 may be between the first and second standard cells SC1 and SC2, and the second filler cell FC2 may be between the second and third standard cells SC2 and SC3. A filler cell may share a well with a standard cell, and may share a well with other standard cells adjacent in a row direction (e.g., the first direction X of FIG. 1). Standard cells arranged in the same row may share a well through a filler cell. For example, the first filler cell FC1 between the first and second standard cells SC1 and SC2 may share a well with the first and second standard cells SC1 and SC2. In addition, the first to third standard cells SC1 to SC3 arranged in the first row R1 may share a well through the first and second filler cells FC1 and FC2. A filler cell may be a non-logic cell that does not contribute to an arithmetic operation of the IC 1. For example, the filler cell may not include a device such as a transistor therein.

A plurality of rows may have different heights from each other in a Y-axis direction. For example, standard cells and filler cells in the first row R1 may have a first height H1, and standard cells and filler cells in the second row R2 may have a second height H2. The first height H1 may be different from the second height H2. For example, the first height H1 may be greater than the second height H2 (H1>H2). The first to sixth standard cells SC1 to SC6 and the first to fourth filler cells FC1 to FC4 may have different lengths from each other in an X-axis direction. For example, the first standard cell SC1 may have a first length L1, the first filler cell FC1 may have a second length L2, the second standard cell SC2 may have a third length L3, the second filler cell FC2 may have a fourth length L4, and the third standard cell SC3 may have a fifth length L5. The first to fifth lengths L1 to L5 may be different from each other. In another embodiment, at least two of the first to fifth lengths L1 to L5 may be the same. For example, the second length L2 may be equal to the fourth length L4.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

At least one of the first to sixth standard cells SC1 to SC6 may include a tapering portion or a reverse tapering portion. When a width of an active region formed in a standard cell is different from a width of an active region formed in a filler cell, the tapering portion or the reverse tapering portion may be formed to maintain continuity. The tapering portion may be formed when the width of the active region formed in the standard cell is less than the width of the active region formed in the filler cell, and the reverse tapering portion may be formed when the width of the active region formed in the standard cell is greater than the width of the active region formed in the filler cell. The tapering portion and the reverse tapering portion will be described in detail below.

Figure 2A:
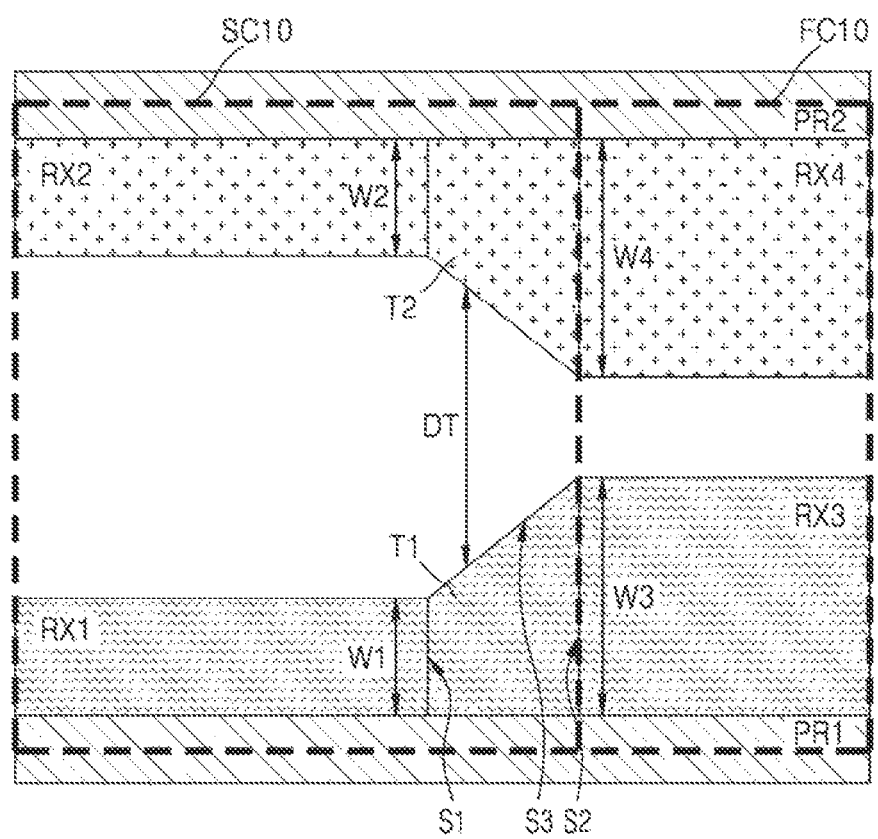
FIGS. 2A to 2C are layout diagrams each illustrating a standard cell including a tapering portion and a filler cell, according to an example embodiment of the inventive concept.
Figure 2B:
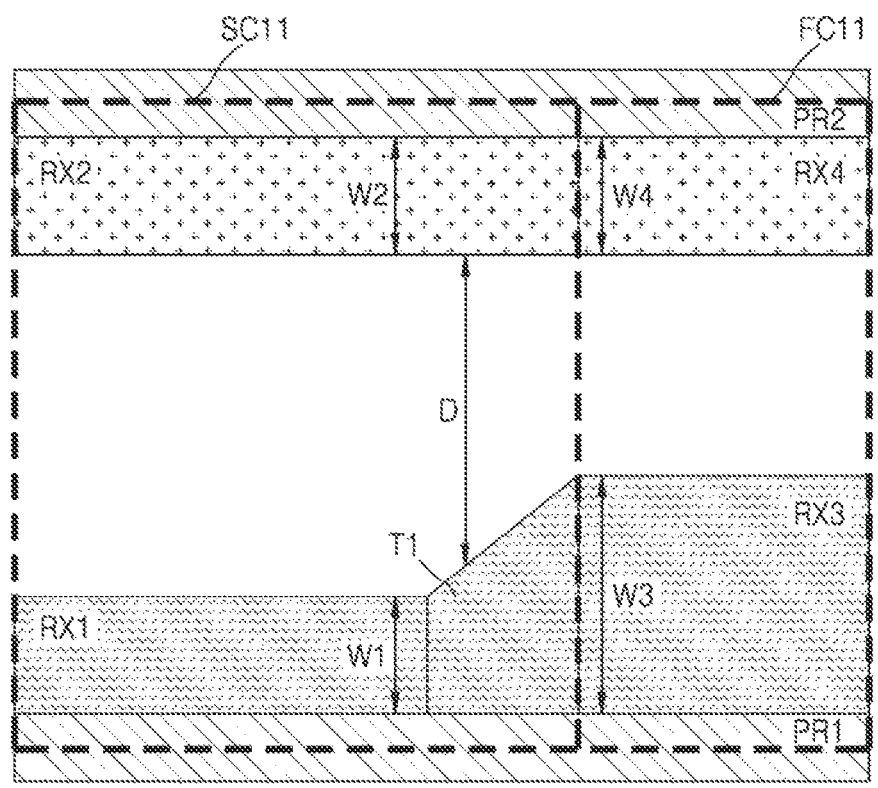
Figure 2C:
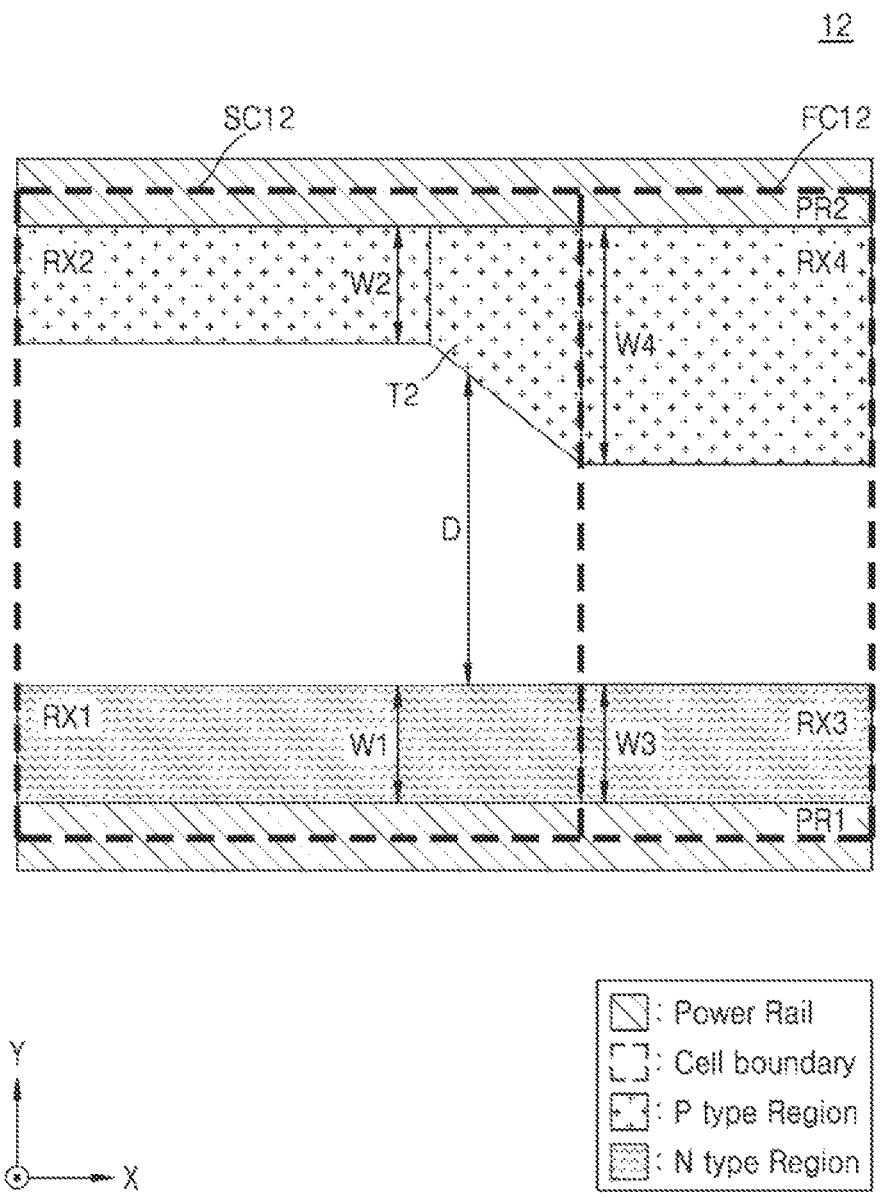

FIGS. 2A to 2C are layout diagrams each illustrating a standard cell including a tapering portion and a filler cell, according to an example embodiment of the inventive concept. In particular, FIGS. 2A to 2C are layout diagrams of a region defined by line A of FIG. 1 to help understanding of FIG. 1. Accordingly, only the first standard cell SC1 and the first filler cell FC1 are shown, but the second to sixth standard cells SC2 to SC6 and the second to fourth filler cells FC2 to FC4 may also include the same layout.

Referring to FIG. 2A, an IC 10 may include first and second power rails PR1 and PR2. The first and second power rails PR1 and PR2 may be spaced apart from each other in the second direction Y, and each of them may extend lengthwise in the first direction X. The first and second power rails PR1 and PR2 may be formed on the same wiring layer. A power voltage or a ground voltage may be applied to the first and second power rails PR1 and PR2. For example, a ground voltage may be applied to the first power rail PR1, and a power voltage may be applied to the second power rail PR2. In other embodiments, the same voltage may be applied to the first and second power rails PR1 and PR2. For example, a power voltage may be applied to both of the first and second power rails PR1 and PR2.

The IC 10 may include a standard cell SC10 and a filler cell FC10. The standard cell SC10 and the filler cell FC10 may be arranged between the first and second power rails PR1 and PR2, and the filler cell FC10 may be arranged adjacent to the standard cell SC10 in the first direction X.

The standard cell SC10 may include first and second active regions RX1 and RX2. The first and second active regions RX1 and RX2 may be spaced apart from each other in the second direction Y and extend in the first direction X. The first active region RX1 may be at a lower boundary of the standard cell SC10, and the second active region RX2 may be at an upper boundary of the standard cell SC10.

The filler cell FC10 may include third and fourth active regions RX3 and RX4. The third and fourth active regions RX3 and RX4 may be spaced apart from each other in the second direction Y and extend in the first direction X. The third active region RX3 may be at a lower boundary of the filler cell FC10, and the fourth active region RX4 may be at an upper boundary of the filler cell FC10.

The first to fourth active regions RX1 to RX4 may be P-type or N-type regions. A P-type region may be a region formed on an N-type substrate or a well, and an N-type region may be a region formed on a P-type substrate or a well. The P-type region may be a region in which a P-type transistor is formed, and the N-type region may be a region in which an N-type transistor is formed. The N-type region may be below a power rail providing a negative supply voltage (e.g., a ground voltage). The P-type region may be below a power rail providing a positive supply voltage (e.g., a power voltage).

The standard cell SC10 may be formed over several types of regions. Accordingly, the standard cell SC10 may have a complementary metal oxide semiconductor (CMOS) structure including the P-type transistor and the N-type transistor. For example, the standard cell SC10 may include the first active region RX1 of an N-type at the bottom and the second active region RX2 of a P-type at the top. However, the inventive concept is not limited thereto, and in another embodiment, the first and second active regions RX1 and RX2 may also be regions of the same type.

The filler cell FC10 may be formed over several types of regions. The third and fourth active regions RX3 and RX4 may be regions of different types from each other. For example, the third active region RX3 may be an N-type region, and the fourth active region RX4 may be a P-type region. However, the inventive concept is not limited thereto, and in another embodiment, the third and fourth active regions RX3 and RX4 may also be regions of the same type.

The first active region RX1 may have a first width W1, and the second active region RX2 may have a second width W2. The first width W1 may be the same as or different from the second width W2. The third active region RX3 may have a third width W3, and the fourth active region RX4 may have a fourth width W4. The third width W3 may be the same as or different from the fourth width W4. In the present embodiment, the first width W1 may be less than the third width W3 (W1<W3), and the second width W2 may be less than the fourth width W4 (W2<W4). A difference between the first width W1 and the third width W3 may be the same as or different from a difference between the second width W2 and the fourth width W4.

The standard cell SC10 may further include a first tapering portion T1 and a second tapering portion T2. A distance DT between the first tapering portion T1 and the second tapering portion T2 may decrease toward the filler cell FC10. In this case, the standard cell SC10 including the first tapering portion T1 and the second tapering portion T2 may be referred to as an "out-bound cell".

The first tapering portion T1 may be between the first active region RX1 and the third active region RX3. Accordingly, the first tapering portion T1 may be adjacent to the first active region RX1 and the third active region RX3 in the first direction X. A minimum width of the first tapering portion T1 may be equal to the first width W1, and a maximum width thereof may be equal to the third width W3. The first tapering portion T1 may have the first width W1 on a surface in contact with the first active region RX1, and the third width W3 on a surface in contact with the third active region RX3. The first tapering portion T1 may include a first surface S1 contacting the first active region RX1 in the first direction X, a second surface S2 contacting the third active region RX3 in the first direction X, and a third surface S3 connecting the first surface S1 to the second surface S2 and having an inclination. The first surface S1 and the second surface S2 may be referred to as "contact surfaces", and the third surface S3 may be referred to as an "inclination surface". The third surface S3 may be inclined with respect to a surface of the first active region RX1 that faces the second active region RX2 and/or a surface of the third active region RX3 that faces the fourth active region RX4.

The third surface S3 may have a straight line or a curved line. The inclination of the third surface S3 may vary depending on the first width W1 and the third width W3. For example, when the difference between the first width W1 and the third width W3 increases, the inclination of the third surface S3 may be steeper. An area of the first tapering portion T1 may vary depending on the first width W1 and the third width W3. For example, when the difference between the first width W1 and the third width W3 increases, the area of the first tapering portion T1 may increase.

The first active region RX1 may be electrically connected to the third active region RX3 by the first tapering portion T1. The first tapering portion T1 may be a region of the same type as that of the first active region RX1. Accordingly, the first active region RX1, the first tapering portion T1, and the third active region RX3 may be the same type. For example, the first active region RX1, the first tapering portion T1, and the third active region RX3 may be N-type. For example, the first active region RX1, the first tapering portion T1, and the third active region RX3 may share a P-well.

The second tapering portion T2 may be between the second active region RX2 and the fourth active region RX4. A minimum width of the second tapering portion T2 may be equal to the second width W2, and a maximum width thereof may be equal to the fourth width W4. The second tapering portion T2 may have the second width W2 on a surface in contact with the second active region RX2, and the fourth width W4 on a surface in contact with the fourth active region RX4. Like the first tapering portion T1, the second tapering portion T2 may include two contact surfaces respectively contacting the second active region RX2 and the fourth active region RX4 in the first direction X, and an inclination surface connecting the two contact surfaces to each other and having an inclination. The inclination surface may be inclined with respect to a surface of the second active region RX2 that faces the first active region RX1 and/or a surface of the fourth active region RX4 that faces the third active region RX3. The inclination surface may have a straight line or a curved line. An area of the second tapering portion T2 may vary depending on the second width W2 and the fourth width W4. For example, when the difference between the second width W2 and the fourth width W4 increases, the area of the second tapering portion T2 may increase.

The second active region RX2 may be electrically connected to the fourth active region RX4 by the second tapering portion T2. The second tapering portion T2 may be a region of the same type as that of the second active region RX2. Accordingly, the second active region RX2, the second tapering portion T2, and the fourth active region RX4 may be the same type. For example, the second active region RX2, the second tapering portion T2, and the fourth active region RX4 may be the P-type. For example, the second active region RX2, the second tapering portion T2, and the fourth active region RX4 may share a N-well.

The filler cell FC10 is formed adjacent to the standard cell SC10 in the first direction X, so that the first and second active regions RX1 and RX2 of the standard cell SC10 may have continuity.

The standard cell SC10 includes the first tapering portion T1 and the second tapering portion T2, so that the standard cell SC10 may secure a wide area of an active region. Accordingly, because an amount of current flowing to a transistor may be increased, electrical characteristics of a semiconductor device may be improved.

In addition, sizes of the first tapering portion T1 and the second tapering portion T2 may vary by adjusting the first to fourth widths W1 to W4. Accordingly, an amount of current flowing to a transistor of the standard cell SC10 may be controlled as needed. Herein, the term "size" may refer to a length in the first direction X and/or a width in the second direction Y.

FIGS. 2B and 2C are other example embodiments of FIG. 2A, and each of them is a layout diagram of the region defined by line A of FIG. 1. Accordingly, descriptions overlapping with those of FIG. 2A will be omitted.

Referring to FIG. 2B, an IC 11 may include a standard cell SC11 and a filler cell FC11.

The standard cell SC11 may include the first and second active regions RX1 and RX2. The first active region RX1 may have the first width W1, and the second active region RX2 may have the second width W2. The first width W1 may be equal to the second width W2 (W1=W2).

The filler cell FC11 may include the third and fourth active regions RX3 and RX4. The third active region RX3 may have the third width W3, and the fourth active region RX4 may have the fourth width W4. The third width W3 may be greater than the fourth width W4 (W3>W4).

In the present embodiment, the second width W2 may be equal to the fourth width W4 (W2=W4). The second active region RX2 may be electrically connected to the fourth active region RX4. The second active region RX2 and the fourth active region RX4 may be regions of the same type. For example, the second active region RX2 and the fourth active region RX4 may be P-type. For example, the second active region RX2 and the fourth active region RX4 may share the N-well.

The first width W1 may be less than the third width W3 (W1<W3). The standard cell SC11 may further include the first tapering portion T1. The first tapering portion T1 may be between the first active region RX1 and the third active region RX3. A distance D between the first tapering portion T1 and the second active region RX2 may decrease toward the filler cell FC11. A size of the first tapering portion T1 may vary depending on the first width W1 and the third width W3. For example, when the difference between the first width W1 and the third width W3 increases, the size of the first tapering portion T1 may increase.

The first active region RX1 may be electrically connected to the third active region RX3 by the first tapering portion T1. The first tapering portion T1 may be a region of the same type as that of the first active region RX1. For example, the first active region RX1, the first tapering portion T1, and the third active region RX3 may be N-type. For example, the first active region RX1, the first tapering portion T1, and the third active region RX3 may share a P-well.

Referring to FIG. 2C, an IC 12 may include a standard cell SC12 and a filler cell FC12. In the present embodiment, the first width W1 may be equal to the second width W2 (W1=W2). The third width W3 may be less than the fourth width W4 (W3<W4). The first width W1 may be equal to the third width W3 (W1=W3).

The first active region RX1 may be electrically connected to the third active region RX3. The first active region RX1 and the third active region RX3 may be regions of the same type. For example, the first active region RX1 and the third active region RX3 may be N-type. For example, the first active region RX1 and the third active region RX3 may share the P-well.

The second width W2 may be less than the fourth width W4 (W2<W4). The standard cell SC12 may further include the second tapering portion T2. The second tapering portion T2 may be between the second active region RX2 and the fourth active region RX4. A distance D between the second tapering portion T2 and the first active region RX1 may decrease toward the filler cell FC12. A size of the second tapering portion T2 may vary depending on the second width W2 and the fourth width W4. For example, when the difference between the second width W2 and the fourth width W4 increases, the size of the second tapering portion T2 may increase.

The second active region RX2 may be electrically connected to the fourth active region RX4 by the second tapering portion T2. The second tapering portion T2 may be a region of the same type as that of the second active region RX2. For example, the second active region RX2, the second tapering portion T2, and the fourth active region RX4 may be P-type. For example, the second active region RX2, the second tapering portion T2, and the fourth active region RX4 may share the N-well.

Figure 3A:
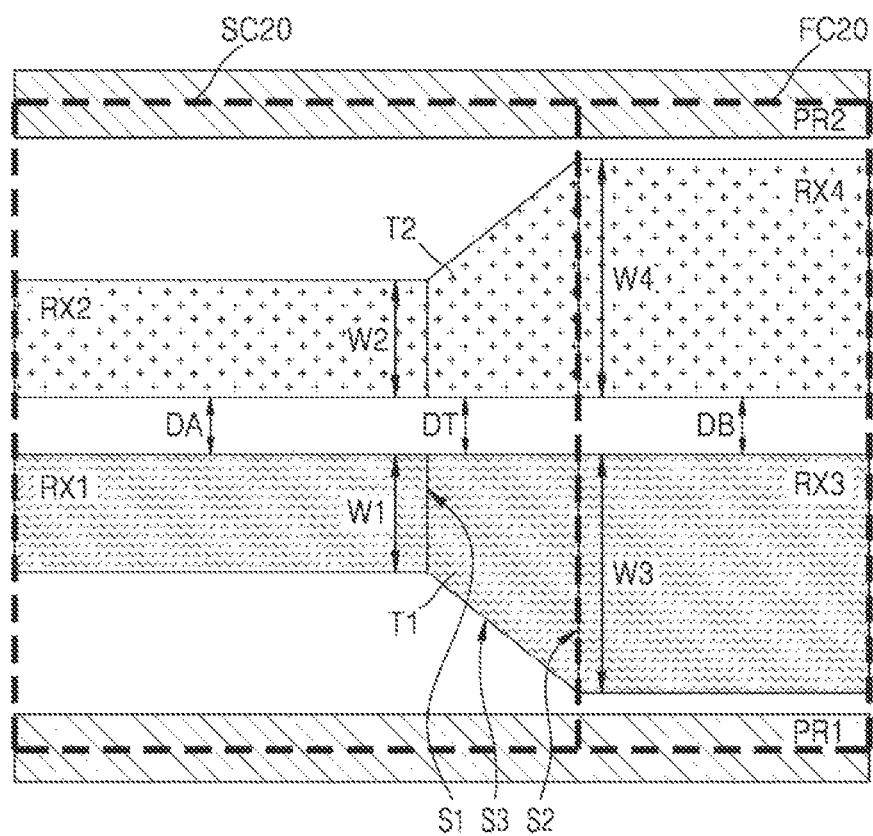
FIGS. 3A to 3C are layout diagrams each illustrating a standard cell including a tapering portion and a filler cell, according to an example embodiment of the inventive concept.
Figure 3B:
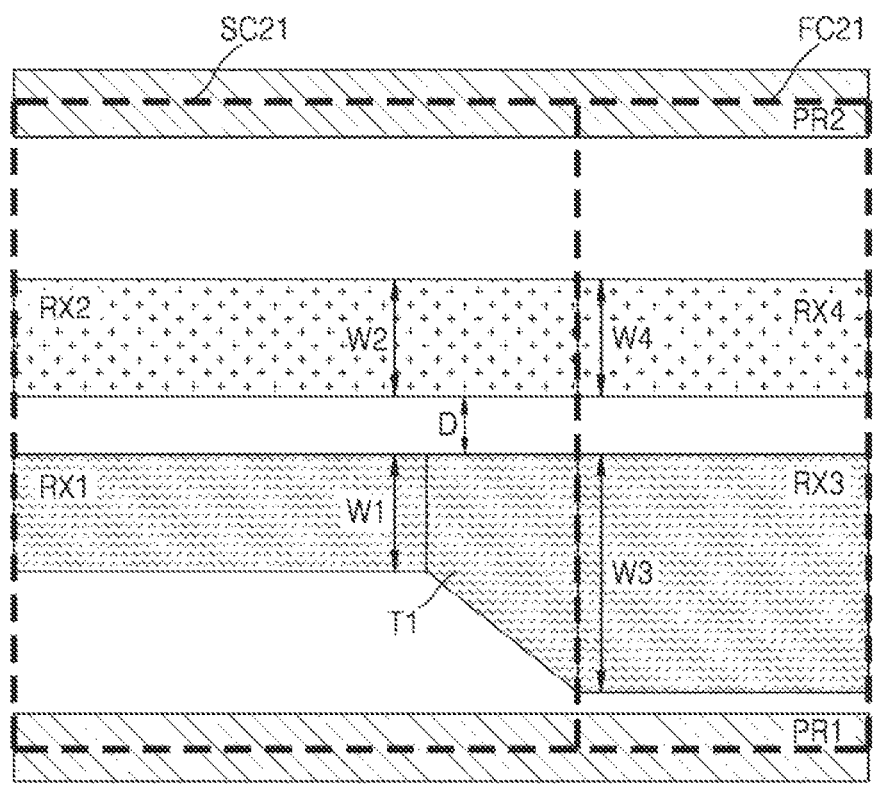
Figure 3C:
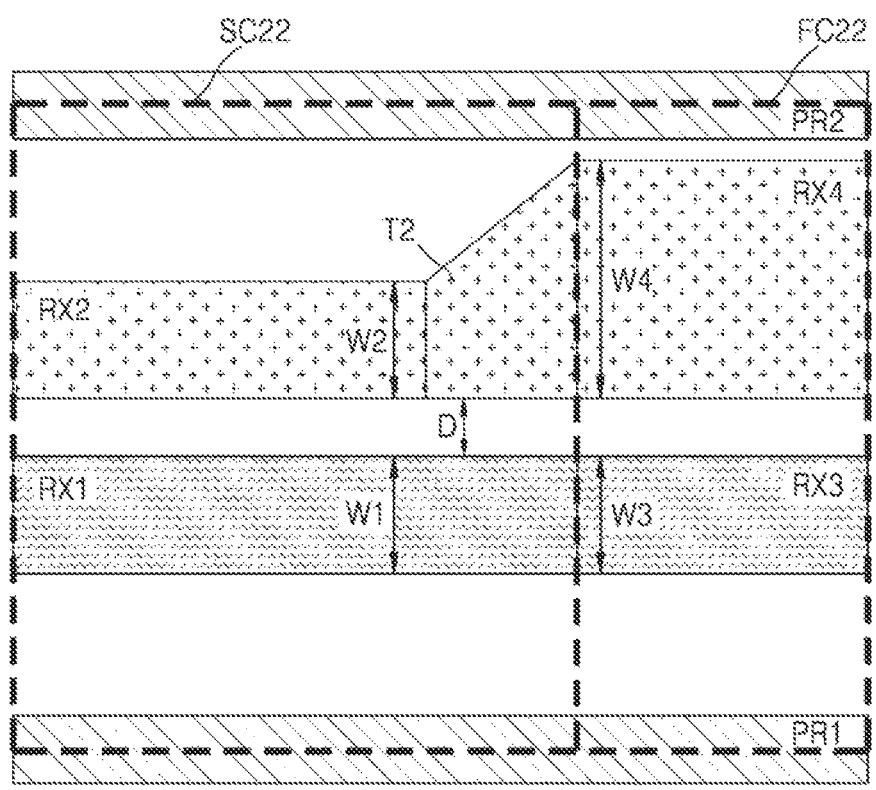

FIGS. 3A to 3C are layout diagrams each illustrating a standard cell including a tapering portion and a filler cell, according to an example embodiment of the inventive concept. In particular, FIG. 3A is another example embodiment of FIG. 2A, and descriptions already given with reference to FIG. 2A will be omitted.

Referring to FIG. 3A, an IC 20 may include the first and second power rails PR1 and PR2. The IC 20 may include a standard cell SC20 and a filler cell FC20. The standard cell SC20 and the filler cell FC20 may be arranged between the first and second power rails PR1 and PR2, and the filler cell FC20 may be arranged adjacent to the standard cell SC20 in the first direction X.

The standard cell SC20 may include the first and second active regions RX1 and RX2. The first and second active regions RX1 and RX2 may be spaced apart from each other in the second direction Y and extend in the first direction X. The first and second active regions RX1 and RX2 may be spaced apart from each other by a first distance DA.

The filler cell FC20 may include the third and fourth active regions RX3 and RX4. The third and fourth active regions RX3 and RX4 may be spaced apart from each other in the second direction Y and extend in the first direction X. The third and fourth active regions RX3 and RX4 may be spaced apart from each other by a second distance DB. The first distance DA may be equal to the second distance DB (DA=DB).

The first active region RX1 may have the first width W1, and the second active region RX2 may have the second width W2. The third active region RX3 may have the third width W3, and the fourth active region RX4 may have the fourth width W4. In the present embodiment, the first width W1 may be less than the third width W3 (W1<W3), and the second width W2 may be less than the fourth width W4 (W2<W4).

The standard cell SC20 may further include the first tapering portion T1 and the second tapering portion T2. A distance DT between the first tapering portion T1 and the second tapering portion T2 may be constant. The distance DT between the first tapering portion T1 and the second tapering portion T2 may be equal to the first distance DA (DT=DA). The distance DT between the first tapering portion T1 and the second tapering portion T2 may be equal to the second distance DB (DT=DB). In this case, the standard cell SC20 including the first tapering portion T1 and the second tapering portion T2 may be referred to as an "in-bound cell".

FIGS. 3B and 3C are other example embodiments of FIG. 3A, and each of them is a layout diagram of the region defined by line A of FIG. 1. Accordingly, descriptions already given with reference to FIG. 3A will be omitted.

Referring to FIG. 3B, an IC 21 may include a standard cell SC21 and a filler cell FC21. The standard cell SC21 may include the first and second active regions RX1 and RX2. The first active region RX1 may have the first width W1, and the second active region RX2 may have the second width W2. The first width W1 may be equal to the second width W2 (W1=W2).

The filler cell FC21 may include the third and fourth active regions RX3 and RX4. The third active region RX3 may have the third width W3, and the fourth active region RX4 may have the fourth width W4. The third width W3 may be greater than the fourth width W4 (W3>W4).

In the present embodiment, the second width W2 may be equal to the fourth width W4 (W2=W4). The second active region RX2 may be electrically connected to the fourth active region RX4. The second active region RX2 and the fourth active region RX4 may be regions of the same type. For example, the second active region RX2 and the fourth active region RX4 may be P-type.

The first width W1 may be less than the third width W3 (W1<W3). The standard cell SC11 may further include the first tapering portion T1. The first tapering portion T1 may be between the first active region RX1 and the third active region RX3. A distance D between the first tapering portion T1 and the second active region RX2 may be constant. A size of the first tapering portion T1 may vary depending on the first width W1 and the third width W3. For example, when the difference between the first width W1 and the third width W3 increases, the size of the first tapering portion T1 may increase.

The first active region RX1 may be electrically connected to the third active region RX3 by the first tapering portion T1. The first tapering portion T1 may be a region of the same type as that of the first active region RX1. For example, the first active region RX1, the first tapering portion T1, and the third active region RX3 may be N-type.

Referring to FIG. 3C, an IC 22 may include a standard cell SC22 and a filler cell FC22. In the present embodiment, the first width W1 may be equal to the second width W2 (W1=W2). The third width W3 may be less than the fourth width W4 (W3<W4). The first width W1 may be equal to the third width W3 (W1=W3).

The first active region RX1 may be electrically connected to the third active region RX3. The first active region RX1 and the third active region RX3 may be regions of the same type. For example, the first active region RX1 and the third active region RX3 may be N-type.

The second width W2 may be less than the fourth width W4 (W2<W4). The standard cell SC22 may include the second tapering portion T2. The second tapering portion T2 may be between the second active region RX2 and the fourth active region RX4. A distance D between the second tapering portion T2 and the first active region RX1 may be constant. An area of the second tapering portion T2 may vary depending on the second width W2 and the fourth width W4. For example, when the difference between the second width W2 and the fourth width W4 increases, the area of the second tapering portion T2 may increase.

The second active region RX2 may be electrically connected to the fourth active region RX4 by the second tapering portion T2. The second tapering portion T2 may be a region of the same type as that of the second active region RX2. For example, the second active region RX2, the second tapering portion T2, and the fourth active region RX4 may be P-type.

Figure 4A:
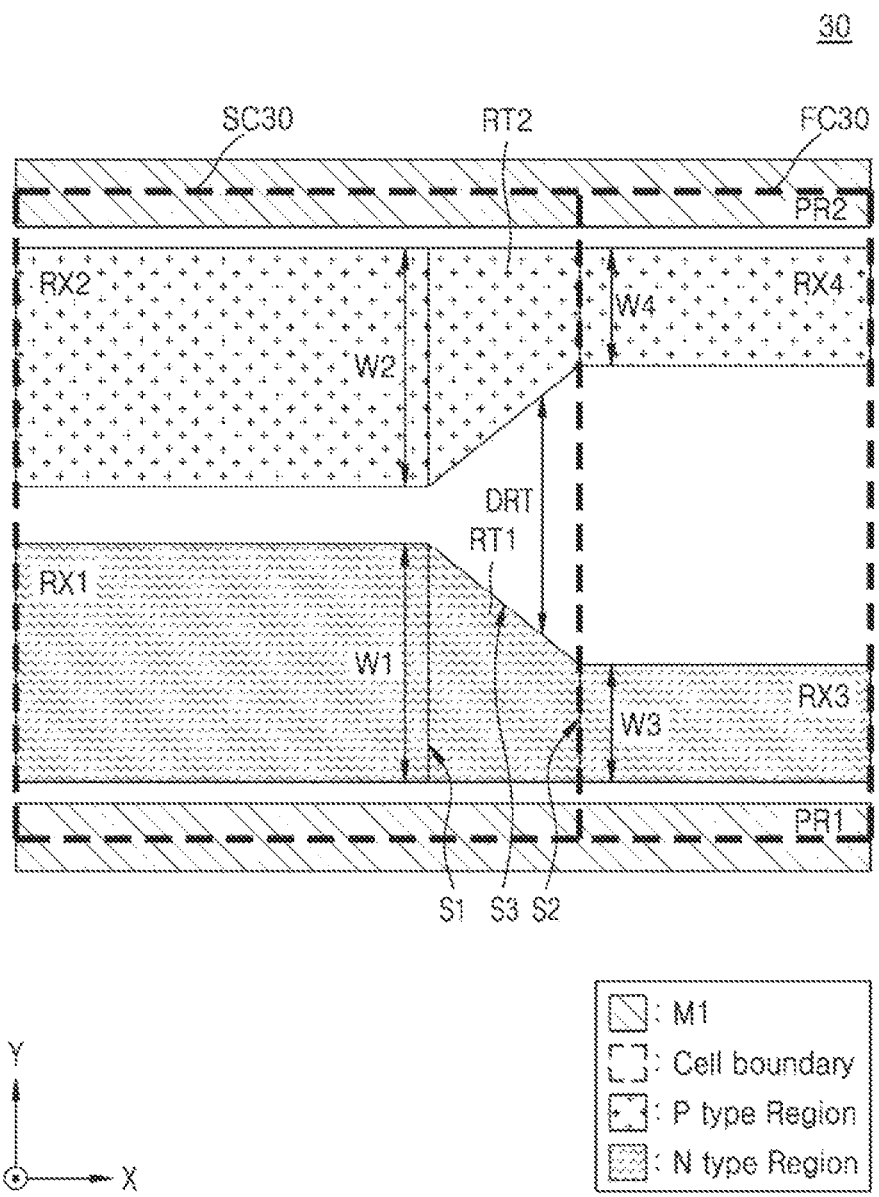
FIGS. 4A to 4C are layout diagrams each illustrating a standard cell including a tapering portion and a filler cell, according to an example embodiment of the inventive concept.
Figure 4B:
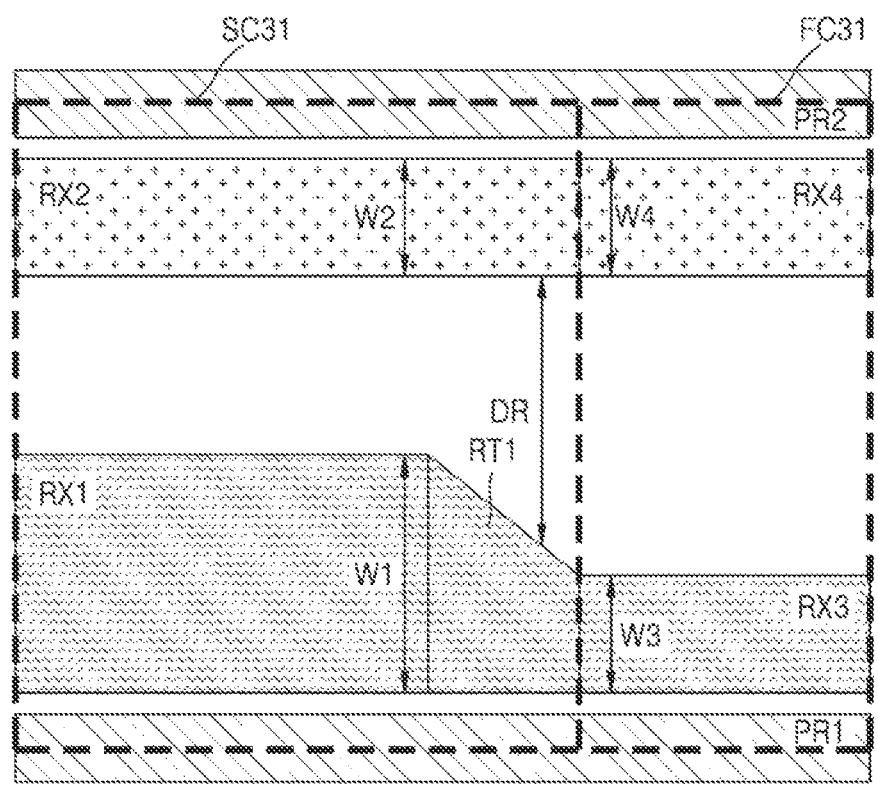
Figure 4C:
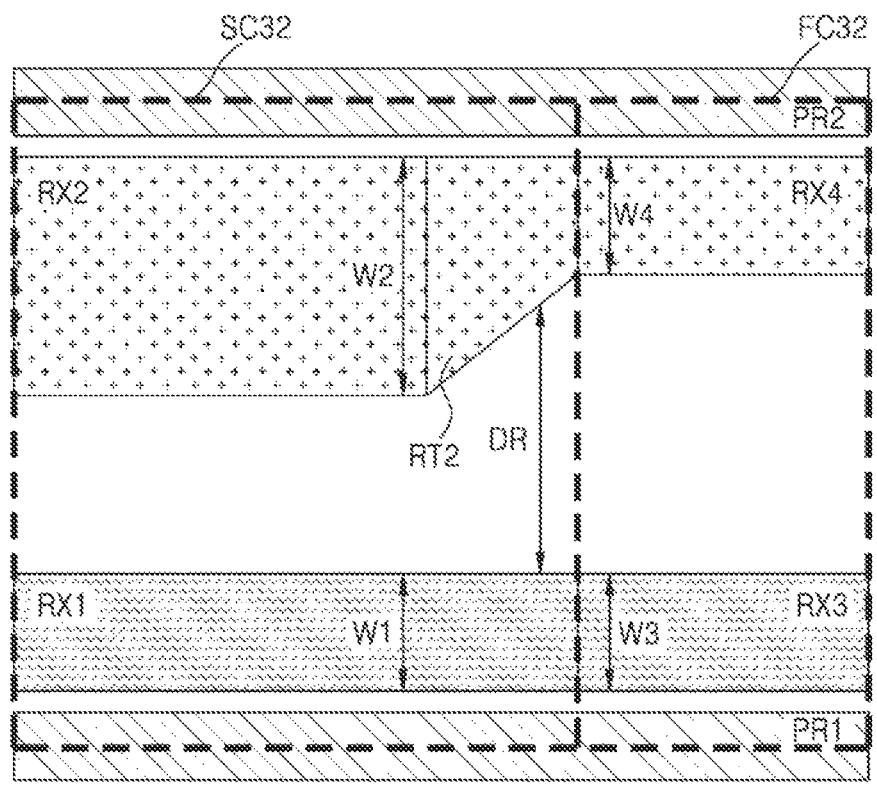

FIGS. 4A to 4C are layout diagrams each illustrating a standard cell including a reverse tapering portion and a filler cell, according to an example embodiment of the inventive concept. In particular, FIG. 4A is another example embodiment of FIG. 2A, and descriptions already given with reference to FIG. 2A will be omitted.

Referring to FIG. 4A, an IC 30 may include the first and second power rails PR1 and PR2. The IC 30 may include a standard cell SC30 and a filler cell FC30. The standard cell SC30 and the filler cell FC30 may be arranged between the first and second power rails PR1 and PR2, and the filler cell FC30 may be arranged adjacent to the standard cell SC30 in the first direction X.

The standard cell SC30 may include the first and second active regions RX1 and RX2. The filler cell FC30 may include the third and fourth active regions RX3 and RX4. The first active region RX1 may have the first width W1, and the second active region RX2 may have the second width W2. The third active region RX3 may have the third width W3, and the fourth active region RX4 may have the fourth width W4. In the present embodiment, the first width W1 may be greater than the third width W3 (W1>W3), and the second width W2 may be greater than the fourth width W4 (W2>W4).

The standard cell SC30 may include a first reverse tapering portion RT1 and a second reverse tapering portion RT2. A distance DRT between the first reverse tapering portion RT1 and the second reverse tapering portion RT2 may increase toward the filler cell FC30.

The first reverse tapering portion RT1 may be between the first active region RX1 and the third active region RX3. Accordingly, the first reverse tapering portion RT1 may be adjacent to the first active region RX1 and the third active region RX3 in the first direction X. A maximum width of the first reverse tapering portion RT1 may be equal to the first width W1, and a minimum width thereof may be equal to the third width W3. The first reverse tapering portion RT1 may include a first surface S1 contacting the first active region RX1 in the first direction X, a second surface S2 contacting the third active region RX3 in the first direction X, and a third surface S3 connecting the first surface S1 to the second surface S2 and having an inclination. The first surface S1 and the second surface S2 may be referred to as "contact surfaces", and the third surface S3 may be referred to as an "inclination surface".

The third surface S3 may have a straight line or a curved line. A size of the first reverse tapering portion RT1 may vary depending on the first width W1 and the third width W3. For example, when the difference between the first width W1 and the third width W3 increases, the size of the first reverse tapering portion RT1 may increase.

The first active region RX1 may be electrically connected to the third active region RX3 by the first reverse tapering portion RT1. For example, the first active region RX1, the first reverse tapering portion RT1, and the third active region RX3 may be N-type.

The second reverse tapering portion RT2 may be between the second active region RX2 and the fourth active region RX4. A maximum width of the second reverse tapering portion RT2 may be equal to the second width W2, and a minimum width thereof may be equal to the fourth width W4. Like the first reverse tapering portion RT1, the second reverse tapering portion RT2 may include two contact surfaces respectively contacting the second active region RX2 and the fourth active region RX4 in the first direction X, and an inclination surface connecting the two contact surfaces to each other and having an inclination. The inclination surface may have a straight line or a curved line. A size of the second reverse tapering portion RT2 may vary depending on the second width W2 and the fourth width W4. For example, when the second width W2 and the fourth width W4 increases, the size of the second reverse tapering portion RT2 may increase.

The second active region RX2 may be electrically connected to the fourth active region RX4 by the second reverse tapering portion RT2. For example, the second active region RX2, the second reverse tapering portion RT2, and the fourth active region RX4 may be P-type.

The standard cell SC30 includes the first reverse tapering portion RT1 and the second reverse tapering portion RT2, so that the standard cell SC30 may secure a narrow size of an active region. Accordingly, because an amount of current flowing to a transistor of the standard cell SC30 may be decreased, leakage current may be improved. In addition, the performance of a semiconductor device may be improved, and a product having high reliability may be provided.

In addition, the sizes of the first reverse tapering portion RT1 and the second reverse tapering portion RT2 may vary by adjusting the first to fourth widths W1 to W4. Accordingly, an amount of current flowing to a transistor of the standard cell SC11 may be controlled as needed.

FIGS. 4B and 4C are other example embodiments of FIG. 4A, and each of them is a layout diagram of the region defined by line A of FIG. 1. Accordingly, descriptions already given with reference to FIG. 4A will be omitted.

Referring to FIG. 4B, an IC 31 may include a standard cell SC31 and a filler cell FC31. The standard cell SC31 may include the first and second active regions RX1 and RX2. The first active region RX1 may have the first width W1, and the second active region RX2 may have the second width W2. The first width W1 may be greater than the second width W2 (W1>W2).

The filler cell FC31 may include the third and fourth active regions RX3 and RX4. The third active region RX3 may have the third width W3, and the fourth active region RX4 may have the fourth width W4. The third width W3 may be equal to the fourth width W4 (W3=W4).

In the present embodiment, the second width W2 may be equal to the fourth width W4 (W2=W4). The second active region RX2 may be electrically connected to the fourth active region RX4. The second active region RX2 and the fourth active region RX4 may be regions of the same type. For example, the second active region RX2 and the fourth active region RX4 may be P-type.

The first width W1 may be greater than the third width W3 (W1>W3). The standard cell SC31 may include the first reverse tapering portion RT1. The first reverse tapering portion RT1 may be between the first active region RX1 and the third active region RX3. A distance DR between the first reverse tapering portion RT1 and the second active region RX2 may increase toward the filler cell FC31. The size of the first reverse tapering portion RT1 may vary depending on the first width W1 and the third width W3.

The first active region RX1 may be electrically connected to the third active region RX3 by the first reverse tapering portion RT1. For example, the first active region RX1, the first reverse tapering portion RT1, and the third active region RX3 may be N-type.

Referring to FIG. 4C, an IC 32 may include a standard cell SC32 and a filler cell FC32. In the present embodiment, the first width W1 may be less than the second width W2 (W1<W2). The third width W3 may be equal to the fourth width W4 (W3=W4). The first width W1 may be equal to the third width W3 (W1=W3).

The first active region RX1 may be electrically connected to the third active region RX3. The first active region RX1 and the third active region RX3 may be regions of the same type. For example, the first active region RX1 and the third active region RX3 may be N-type.

The second width W2 may be greater than the fourth width W4 (W2>W4). The standard cell SC32 may include the second reverse tapering portion RT2. The second reverse tapering portion RT2 may be between the second active region RX2 and the fourth active region RX4. The distance DR between the second reverse tapering portion RT2 and the first active region RX1 may increase toward the filler cell FC32. The size of the second reverse tapering portion RT2 may vary depending on the second width W2 and the fourth width W4.

The second active region RX2 may be electrically connected to the fourth active region RX4 by the second reverse tapering portion RT2. For example, the second active region RX2, the second reverse tapering portion RT2, and the fourth active region RX4 may be P-type.

Figure 5A:
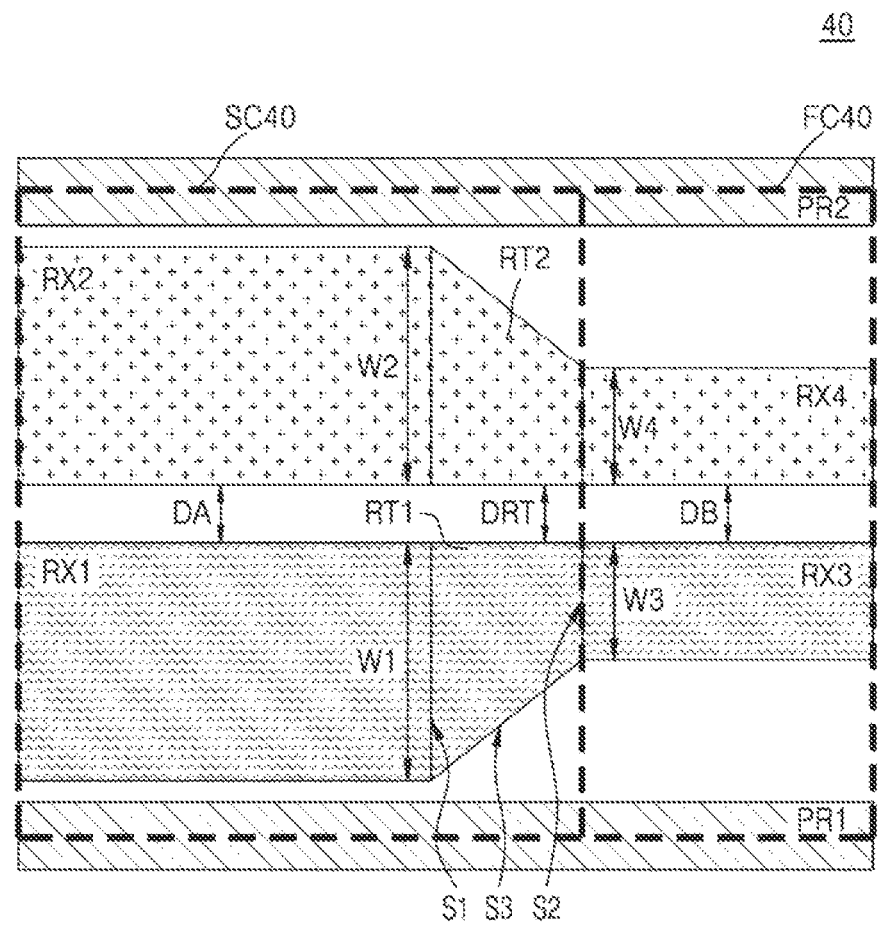
FIGS. 5A to 5C are layout diagrams each illustrating a standard cell including a tapering portion and a filler cell, according to an example embodiment of the inventive concept.
Figure 5B:
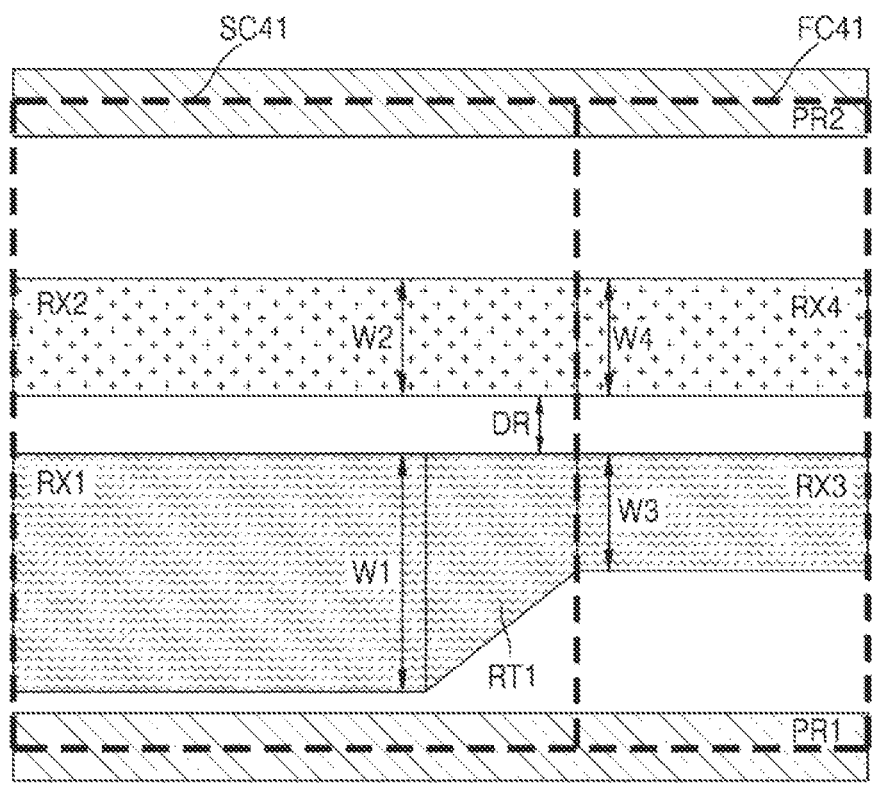
Figure 5C:
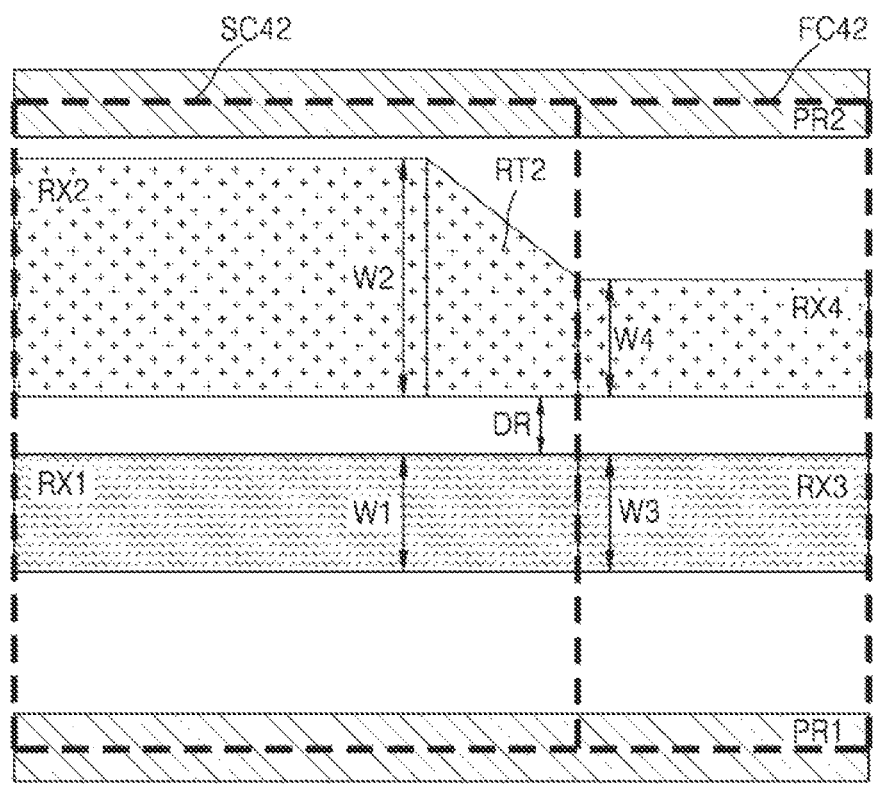

FIGS. 5A to 5C are layout diagrams each illustrating a standard cell including a reverse tapering portion and a filler cell, according to an example embodiment of the inventive concept. In particular, FIG. 5A is another example embodiment of FIG. 4A, and descriptions already given with reference to FIG. 4A will be omitted.

Referring to FIG. 5A, an IC 40 may include the first and second power rails PR1 and PR2.

The IC 40 may include a standard cell SC40 and a filler cell FC40.

The standard cell SC40 may include the first and second active regions RX1 and RX2. The first and second active regions RX1 and RX2 may be spaced apart from each other in the second direction Y and extend in the first direction X.

The first and second active regions RX1 and RX2 may be spaced apart from each other by the first distance DA.

The filler cell FC40 may include the third and fourth active regions RX3 and RX4. The third and fourth active regions RX3 and RX4 may be spaced apart from each other in the second direction Y and extend in the first direction X. The third and fourth active regions RX3 and RX4 may be spaced apart from each other by the second distance DB. The first distance DA may be equal to the second distance DB (DA=DB).

The first active region RX1 may have the first width W1, and the second active region RX2 may have the second width W2. The third active region RX3 may have the third width W3, and the fourth active region RX4 may have the fourth width W4. In the present embodiment, the first width W1 may be greater than the third width W3 (W1>W3), and the second width W2 may be greater than the fourth width W4 (W2>W4).

The standard cell SC40 may further include the first reverse tapering portion RT1 and the second reverse tapering portion RT2. The distance DRT between the first reverse tapering portion RT1 and the second reverse tapering portion RT2 may be constant. The distance DRT between the first reverse tapering portion RT1 and the second reverse tapering portion RT2 may be equal to the first distance DA (DRT=DA). The distance DRT between the first reverse tapering portion RT1 and the second reverse tapering portion RT2 may be equal to the second distance DB (DRT=DB).

FIGS. 5B and 5C are other example embodiments of FIG. 5A, and each of them is a layout diagram of the region defined by line A of FIG. 1. Accordingly, descriptions already given with reference to FIG. 5A will be omitted.

Referring to FIG. 5B, an IC 41 may include a standard cell SC41 and a filler cell FC41. The standard cell SC41 may include the first and second active regions RX1 and RX2. The first active region RX1 may have the first width W1, and the second active region RX2 may have the second width W2. The first width W1 may be greater than the second width W2 (W1>W2).

The filler cell FC41 may include the third and fourth active regions RX3 and RX4. The third active region RX3 may have the third width W3, and the fourth active region RX4 may have the fourth width W4. The third width W3 may be equal to the fourth width W4 (W3=W4).

In the present embodiment, the second width W2 may be equal to the fourth width W4 (W2=W4). The second active region RX2 may be electrically connected to the fourth active region RX4. The second active region RX2 and the fourth active region RX4 may be regions of the same type. For example, the second active region RX2 and the fourth active region RX4 may be P-type.

The first width W1 may be greater than the third width W3 (W1>W3). The standard cell SC41 may further include the first reverse tapering portion RT1. The first reverse tapering portion RT1 may be between the first active region RX1 and the third active region RX3. A distance DR between the first reverse tapering portion RT1 and the second active region RX2 may be constant.

The first active region RX1 may be electrically connected to the third active region RX3 by the first reverse tapering portion RT1. The first reverse tapering portion RT1 may be a region of the same type as that of the first active region RX1. For example, the first active region RX1, the first reverse tapering portion RT1, and the third active region RX3 may be N-type.

Referring to FIG. 5C, an IC 42 may include a standard cell SC42 and a filler cell FC42. In the present embodiment, the first width W1 may be less than the second width W2 (W1<W2). The third width W3 may be equal to the fourth width W4 (W3=W4). The first width W1 may be equal to the third width W3 (W1=W3).

The first active region RX1 may be electrically connected to the third active region RX3. The first active region RX1 and the third active region RX3 may be regions of the same type. For example, the first active region RX1 and the third active region RX3 may be N-type.

The second width W2 may be greater than the fourth width W4 (W2>W4). The standard cell SC42 may include the second reverse tapering portion RT2. The second reverse tapering portion RT2 may be between the second active region RX2 and the fourth active region RX4. A distance DR between the second reverse tapering portion RT2 and the first active region RX1 may be constant. An area of the second reverse tapering portion RT2 may vary depending on the second width W2 and the fourth width W4.

The second active region RX2 may be electrically connected to the fourth active region RX4 by the second reverse tapering portion RT2. The second reverse tapering portion RT2 may be a region of the same type as that of the second active region RX2. For example, the second active region RX2, the second reverse tapering portion RT2, and the fourth active region RX4 may be P-type.

Figure 6:
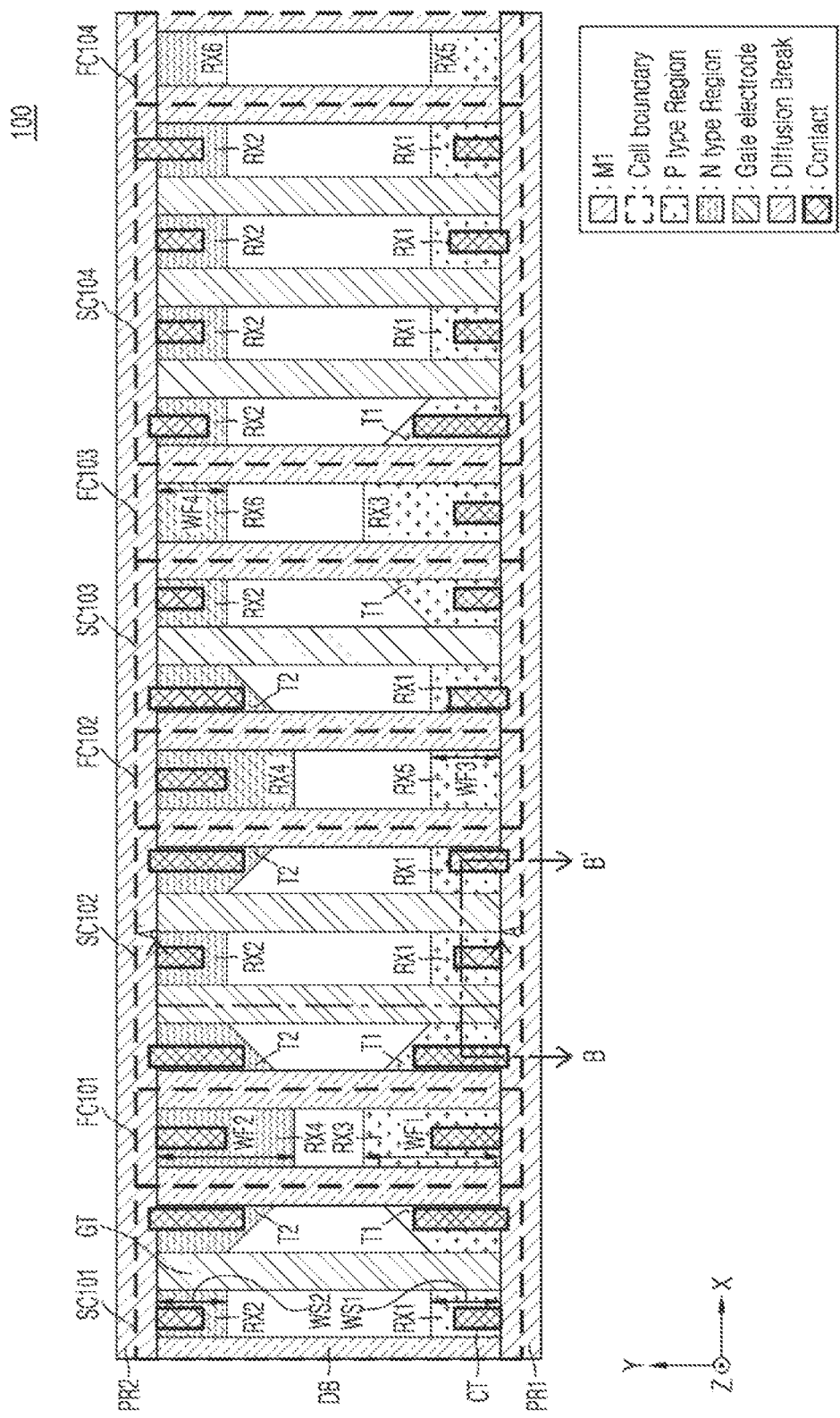
FIG. 6 is a layout diagram of an IC, according to an example embodiment of the inventive concept.

FIG. 6 is a layout diagram of an IC 100 according to an example embodiment of the inventive concept. In particular, FIG. 6 is another example embodiment of FIGS. 2A to 2C.

Accordingly, descriptions already given with reference to FIG. 2A will be omitted.

Referring to FIG. 6, the IC 100 may include the first and second power rails PR1 and PR2. The first and second power rails PR1 and PR2 may be spaced apart from each other in the second direction Y, and each of them may extend in the first direction X.

The IC 100 may include a plurality of standard cells SC101 to SC104 (e.g., first to fourth standard cells SC101 to SC104) and a plurality of filler cells FC101 to FC104 (e.g., first to fourth filler cells FC101 to FC104). The plurality of standard cells SC101 to SC104 may be spaced apart from each other in the first direction X. Each of the plurality of filler cells FC101 to FC104 may be between a pair of the plurality of standard cells SC101 to SC104. Accordingly, the plurality of standard cells SC101 to SC104 and the plurality of filler cells FC101 to FC104 may be arranged adjacent to each other in the first direction X.

Each of the plurality of standard cells SC101 to SC104 may include the first and second active regions RX1 and RX2. The first and second active regions RX1 and RX2 may be spaced apart from each other in the second direction Y and extend in the first direction X. A width WS1 of the first active region RX1 may be equal to a width WS2 of the second active region RX2 (WS1=WS2).

The plurality of filler cells FC101 to FC104 may include third to sixth active regions RX3 to RX6. Each of the plurality of filler cells FC101 to FC104 may include at least one of the third to sixth active regions RX3 to RX6. For example, the first filler cell FC101 may include the third active region RX3 and the fourth active region RX4, the second filler cell FC102 may include the fourth active region RX4 and the fifth active region RX5, and the third filler cell FC103 may include the third active region RX3 and the sixth active region RX6.

The third active region RX3 and the fifth active region RX5 may be the same type. The fourth active region RX4 and the sixth active region RX6 may be the same type. For example, the third active region RX3 and the fifth active region RX5 may be P-type, and the fourth active region RX4 and the sixth active region RX6 may be N-type. However, it is not limited thereto, the third active region RX3 and the fifth active region RX5 may be N-type, and the fourth active region RX4 and the sixth active region RX6 may be P-type. A width WF1 of the third active region RX3 may be equal to a width WF2 of the fourth active region RX4 (WF1=WF2), and a width WF3 of the fifth active region RX5 may be equal to a width WF4 of the sixth active region RX6 (WF3=WF4). The width WF1 of the third active region RX3 may be greater than the width WF3 of the fifth active region RX5 (WF1>WF3), and the width WF2 of the fourth active region RX4 may be greater than the width WF4 of the sixth active region RX6 (WF2>WF4). The width WF3 of the fifth active region RX5 may be equal to the width WS1 of the first active region RX1 (WF3=WS1). The width WF4 of the sixth active region RX6 may be equal to the width WS2 of the second active region RX2 (WF4=WS2). The widths WF1 to WF6 may be widths in the second direction Y.

At least one of the plurality of standard cells SC101 to SC104 may include at least one of the first tapering portion T1 and the second tapering portion T2. For example, the first standard cell SC101 may include the first tapering portion T1 and the second tapering portion T2. The fourth standard cell SC104 may include only the first tapering portion T1. In the present embodiment, a distance between the first tapering portion T1 and the second tapering portion T2 may decrease toward the first to fourth filler cells FC101 to FC104. The first tapering portion T1 and the second tapering portion T2 may be the same as those described with reference to FIGS. 2A to 2C.

The plurality of standard cells SC101 to SC104 may include at least one of the first tapering portion T1 and the second tapering portion T2 as desired. Accordingly, electrical characteristics of each of the plurality of standard cells SC101 to SC104 may be controlled. In the present embodiment, the IC 100 is configured by using the embodiments of FIGS. 2A to 2C, but is not limited thereto. In addition, an IC including a reverse tapering portion may also be configured by using the embodiments of FIGS. 4A to 4C.

Each of the plurality of standard cells SC101 to SC104 may include a plurality of gate terminals GT. The plurality of gate terminals GT may be spaced apart from each other in the first direction X, and each of the plurality of gate terminals GT may extend lengthwise in the second direction Y. Accordingly, the plurality of gate terminals GT may partially overlap the first and second active regions RX1 and RX2. The plurality of gate terminals GT may have a structure corresponding to gate ends of transistors included in the IC 100. The plurality of gate terminals GT may be below the first and second power rails PR1 and PR2. Each of the plurality of standard cells SC101 to SC104 may include a different number of gate terminals GT. The number of gate terminals GT included may vary depending on the length (e.g., lengths L1, L3, and L5 of FIG. 1) of a standard cell. For example, the first standard cell SC101 may include one gate electrode GT, and the second standard cell SC102 may include two gate electrodes GT.

In the inventive concept, the transistors may be described below as gate-all-around FETs (GAAFETs), but may have arbitrary structures. For example, the transistors may include multi-bridge channel FETs (MBCFETs) formed by a plurality of nanosheets extending parallel to each other and a gate electrode. The transistors may also include ForkFETs in which an N-type transistor and a P-type transistor have a closer structure by separating nanosheets for a P-type transistor and nanosheets for an N-type transistor are separated with a dielectric wall. The transistors may also include vertical FETs (VFETs) including a gate electrode surrounding source/drain regions, which are spaced apart from each other in a Z-axis direction, and a channel region. The transistors may also include fin field transistors (FinFETs) formed by an active pattern extending in a form of a fin and a gate electrode. The transistors may not only include field effect transistors (FETs) such as complementary FETs (CFETs), negative FETs (NCFETs), carbon nanotube (CNT) FETs, but also include bipolar junction transistors, other tree-dimensional transistors. The transistors will be described below in detail with reference to FIG. 7.

The IC 100 may include a plurality of diffusion breaks DB formed at a boundary between the plurality of standard cells SC101 to SC104 and the plurality of filler cells FC101 to FC104. Diffusion regions and/or fins may be separated between cells adjacent to each other by the plurality of diffusion breaks DB. The plurality of diffusion breaks DB may be filled with an insulator. An effect occurring between standard cells and filler cells, for example, a local layout effect (LLE), may be reduced by the plurality of diffusion breaks DB. In the present embodiment, the plurality of diffusion breaks DB are expressed as being shared by neighboring standard cells and filler cells, but may be included in any one cell. In addition, the plurality of diffusion breaks DB are shown to have the same height as that of the plurality of standard cells SC101 to SC104 and the plurality of filler cells FC101 to FC104 in the second direction Y, but in some embodiments, may have a height less than that of the plurality of standard cells SC101 to SC104 in the second direction Y, and may be discontinuously separated as portions corresponding to each of the first to sixth active regions RX1 to RX6.

The IC 100 may include contacts CT connected to transistors included in each of the plurality of standard cells SC101 to SC104. The contacts CT may be connected to the first and second active regions RX1 and RX2 of the plurality of standard cells SC101 to SC104 and the first and second tapering portions T1 and T2. Some of the plurality of filler cells FC101 to FC104 may include the contacts CT. As desired, in the plurality of filler cells FC101 to FC104, the contacts CT may not be formed. For example, the first filler cell FC101 may include the contacts CT, and the fourth filler cell FC104 may not include the contacts CT. The contacts CT may be connected to the third to sixth active regions RX3 to RX6 of the plurality of filler cells FC101 to FC104. The contacts CT may be connected to a transistor or the first to sixth active regions RX1 to RX6 to transmit an electrical signal. The contacts CT may include a metal material.

Figure 7:
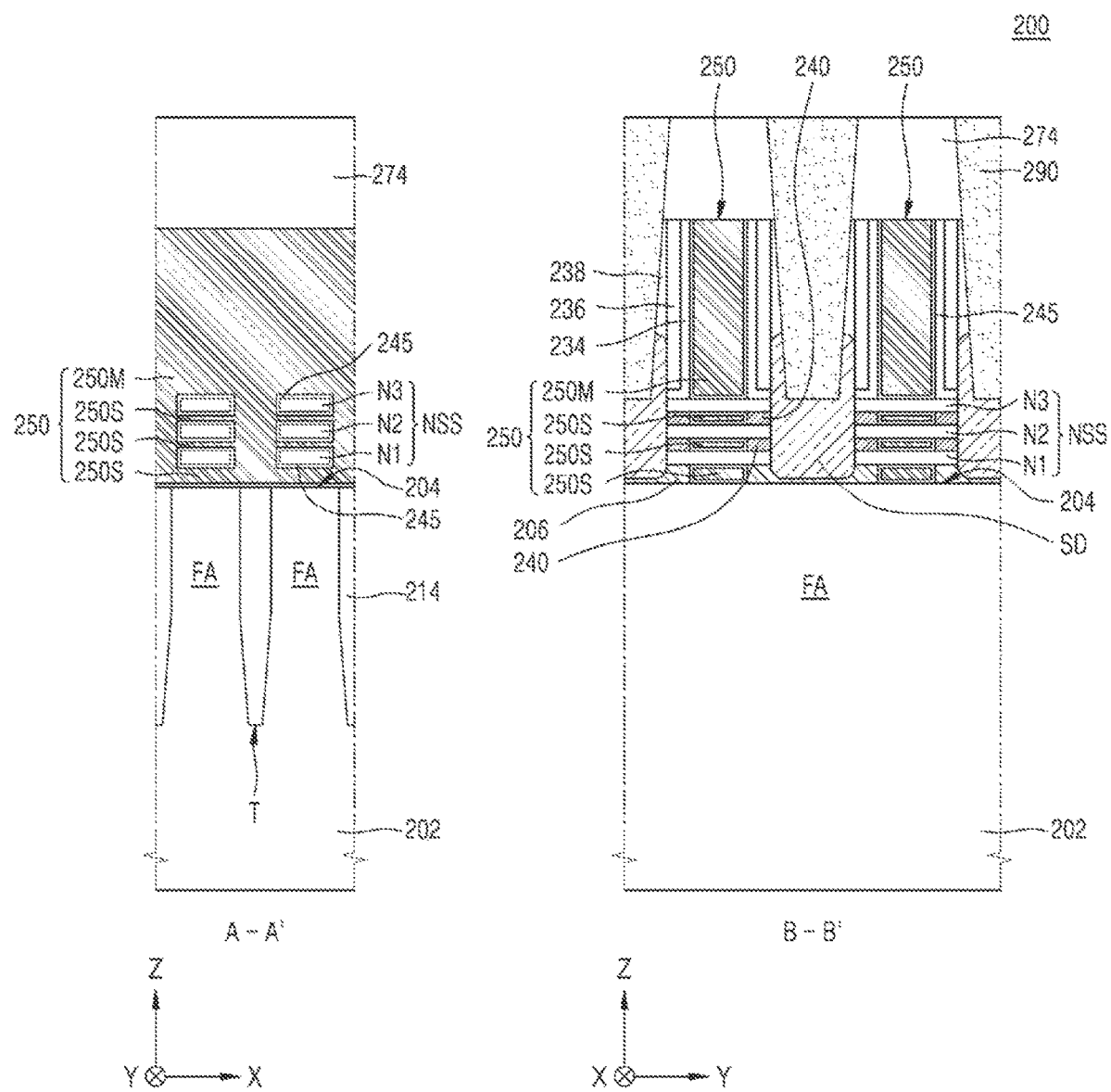
FIG. 7 is a cross-sectional view of the IC taken along lines A-A' and B-B' of FIG. 6.

FIG. 7 is a cross-sectional view of the IC 100 taken along lines A-A' and B-B' of FIG. 6. In particular, FIG. 7 is a cross-sectional view for explaining a transistor formed in the plurality of standard cells SC101 to SC104 of FIG. 6. The plurality of standard cells SC101 to SC104 of FIG. 6 may include a gate-all-around transistor, and particularly, may include a multi-bridge channel transistor 200. The present embodiment relates to an IC including the multi-bridge channel transistor 200, and descriptions of the first and second power rails PR1 and PR2 of FIG. 6 will be omitted.

Referring to FIG. 7, the multi-bridge channel transistor 200 may include a plurality of fin-type active regions FA protruding from a substrate 202 and extending lengthwise in the second direction Y, and a plurality of nanosheet stacked structures NSS facing an upper surface 204 of the plurality fin-type active regions FA at a position apart from the upper surface 204 of the plurality fin-type active regions FA. The plurality fin-type active regions FA may refer to the first and second active regions RX1 and RX2 of FIG. 6.

A trench T defining the plurality fin-type active regions FA may be formed in the substrate 202. The substrate 202 may include a conductive region, for example, a well doped with an impurity, or a structure doped with an impurity. The trench T may be filled with a shallow trench isolation (STI) film 214. The STI film 214 may include an insulating material. A level of the upper surface 204 of the plurality fin-type active regions FA may be the same as or similar to an upper surface of the STI film 214. For example, the upper surface 204 of the plurality fin-type active regions FA may be coplanar with the upper surface of the STI film 214.

The plurality of nanosheet stacked structures NSS may be spaced apart from the upper surface 204 of the plurality fin-type active regions FA. The plurality of nanosheet stacked structures NSS may include nanosheets N1, N2, and N3 extending parallel to the upper surface 204 of the plurality of fin-type active regions FA. The nanosheets N1, N2, and N3 may be sequentially stacked on the upper surface 204 of the plurality fin-type active regions FA, and may each have a channel region. In the present embodiment, a configuration in which the nanosheets N1, N2, and N3 and a plurality of gates 250 are formed on one fin-type active region FA, and three nanosheets N1, N2, and N3 are stacked on the plurality of nanosheet stacked structures NSS is shown, but the inventive concept is not limited thereto. Although a case where a planar shape of the nanosheet stacked structure NSS has an approximately rectangular shape is illustrated, the inventive concept is not limited thereto, and the nanosheet stacked structure NSS may have various planar shapes depending on a planar shape of the fin-type active region FA and a planar shape of the plurality of gates 250. The nanosheet N1, N2, and N3 may include the same material as that of the substrate 202. The plurality of gates 250 may refer to the gate electrodes GT of FIG. 6.

On the plurality fin-type active regions FA, the plurality of gates 250 may extend lengthwise in the second direction Y crossing the first direction X. Each of the plurality of gates 250 may cover the nanosheet stacked structure NSS, and surround at least a portion of the plurality of nanosheet stacked structures NSS. Each of the plurality of gates 250 may include a main gate portion 250M covering an upper surface of the nanosheet stacked structure NSS and a plurality of sub gate portions 250S formed between the fin-type active region FA and the nanosheets N1, N2, and N3. A plurality of main gate portions 250M and the plurality of sub gate portions 250S may be connected to each other. A thickness of each of the plurality of sub gate portion 250S may be less than a thickness of the main gate portion 250M.

A gate dielectric film 245 may be formed between the nanosheet stacked structure NSS and the gate electrode 250. An interlayer insulating film 274 may be formed on the gate 250.

Thereafter, a source/drain region SD may be formed in the fin-type active region FA. The source/drain region SD may be connected to one end of each of the nanosheets N1, N2, and N3, which are adjacent to each other. An insulating liner 234 covering a sidewall of the gate 250, a first insulating spacer 236 on the insulating liner 234, and a protective film 238 on the first insulating spacer 236 may be formed on the nanosheet stacked structure NSS. The insulating liner 234, the first insulating spacer 236, and the protective film 238 may cover the sidewall of the main gate portion 250M. In another embodiment, the protective film 238 may be omitted.

A second insulating spacer 240 covering sidewalls of at least some of the plurality of sub gate portions 250S may be formed. The second insulating spacer 240 may be between the nanosheets N1, N2, and N3. The second insulating spacer 240 may be between the sub gate portion 250S and the source/drain region SD.

Both sidewalls of the sub gate portion 250S, which is the closest to the fin-type active region FA, may be covered with a buffer semiconductor layer 206 covering the upper surface 204 of the fin-type active region FA. The buffer semiconductor layer 206 may include a material different from that of the fin-type active region FA.

A contact plug 290 may be connected to the source/drain region SD. The contact plug 290 may pass through the interlayer insulating film 274 and the protective film 238 to be connected to the source/drain region SD.

Figure 8:
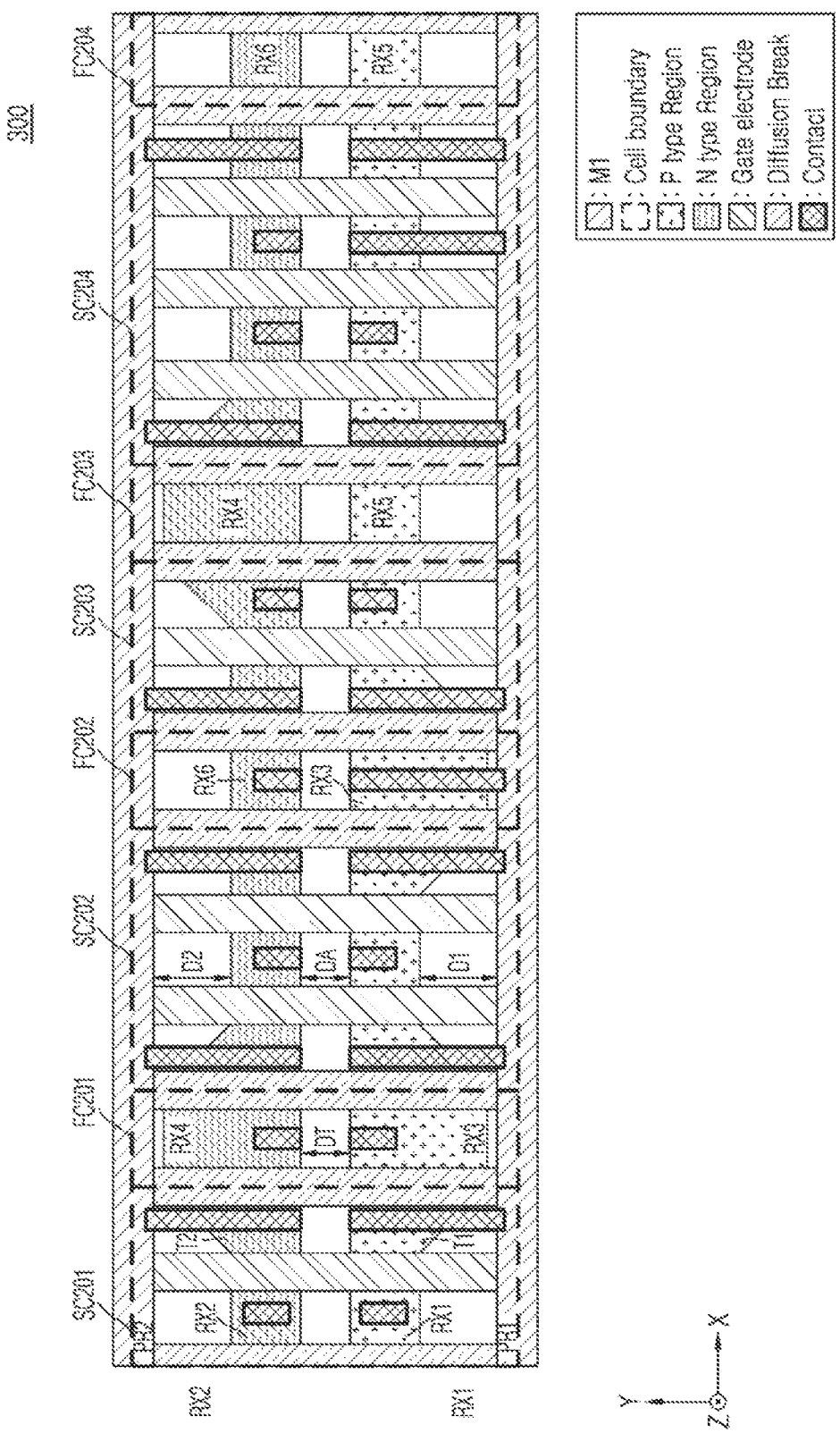
FIG. 8 is a layout diagram of an IC, according to an example embodiment of the inventive concept.

FIG. 8 is a layout diagram of an IC 300 according to an example embodiment of the inventive concept. In particular, FIG. 8 is another example embodiment of FIG. 6. Accordingly, descriptions already given with reference to FIG. 6 will be omitted.

Referring to FIG. 8, the IC 300 may include a plurality of standard cells SC201 to SC204 (e.g., first to fourth standard cells SC201 to SC204) and a plurality of filler cells FC201 to FC204 (e.g., first to fourth filler cells FC201 to FC204).

Each of the plurality of standard cells SC201 to SC204 may include the first and second active regions RX1 and RX2. A distance D1 between the first active region RX1 and the first power rail PR1 may be equal to a distance D2 between the second active region RX2 and the second power rail PR2 (D1=D2).

The plurality of filler cells FC201 to FC204 may include at least one of the third to sixth active regions RX3 to RX6. Accordingly, active areas forming each of the plurality of filler cells FC201 to FC204 may be different from each other. For example, the first filler cell FC201 may include the third active region RX3 and the fourth active region RX4, and the second filler cell FC202 may include the third active region RX3 and the sixth active region RX6.

At least one of the plurality of standard cells SC201 to SC204 may include the first tapering portion T1 and/or the second tapering portion T2. For example, the first standard cell SC201 may include the first tapering portion T1 and the second tapering portion T2. For example, the fourth standard cell SC204 may include only a tapering portion in the P-type region. A distance DT between the first tapering portion T1 and the second tapering portion T2 of the first standard cell SC201 may be constant. The distance DT between the first tapering portion T1 and the second tapering portion T2 may be equal to a distance DA between the first and second active regions RX1 and RX2. The first tapering portion T1 and the second tapering portion T2 may be the same as those described with reference to FIGS. 3A to 3C.

In the present embodiment, the IC 300 is configured by using the embodiments of FIGS. 3A to 3C, but is not limited thereto. Accordingly, an IC may be configured by combining the embodiments of FIGS. 2A to 5C. For example, an IC including a reverse tapering portion may also be configured by using the embodiments of FIGS. 5A to 5C.

Figure 9:
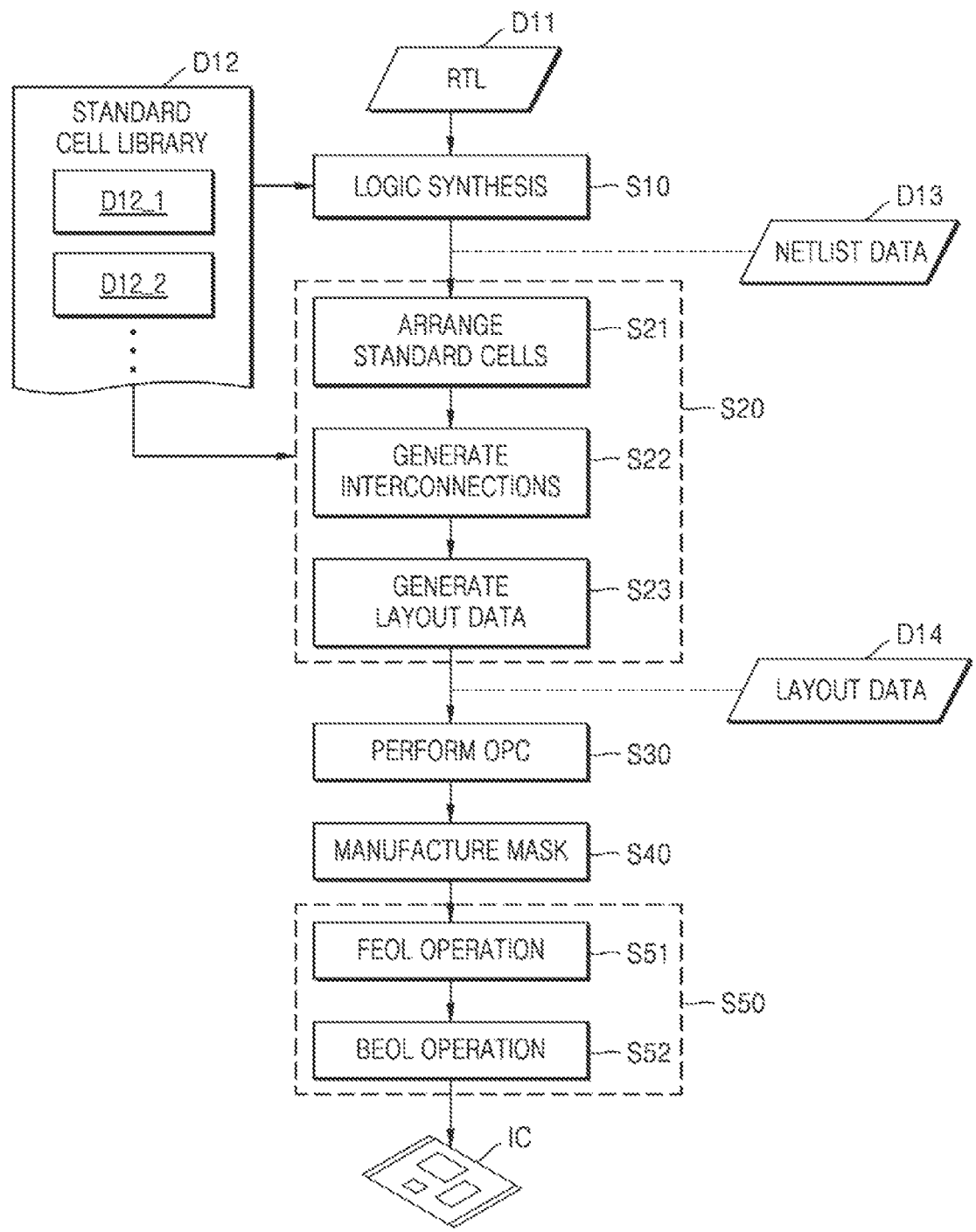
FIG. 9 is a flowchart illustrating a method of fabricating an IC, according to an example embodiment of the inventive concept.

FIG. 9 is a flowchart illustrating a method of manufacturing an IC, according to an example embodiment of the inventive concept.

Referring to FIG. 9, a standard cell library D12 may include information about the first to sixth standard cells SC1 to SC6. For example, the standard cell library D12 may include function information, characteristics information, and layout information of standard cells. In the present embodiment, the standard cell library D12 may include data D12_1, D12_2, or the like defining the layout of the standard cells. The standard cells may have a structure conforming to a predetermined specification.

In operation 510, a logic synthesis operation of generating netlist data D13 from register-transfer level (RTL) data D11 may be performed. For example, a semiconductor design tool may refer to the standard cell library D12 to perform logical synthesis from the RTL data D11 written in hardware description language (HDL), thereby generating the netlist data D13 including a bitstream or a netlist. The HDL may include VHSIC hardware description language (VHDL), Verilog, or the like. The standard cell library D12 may include information such as a height of a standard cell, the number of pins included in the standard cell, the number of tracks corresponding to the standard cell, or the like. In the logic synthesis operation, the standard cells may be included in an IC by referring to the information of the standard cell library D12.

In operation 520, a place & routing (P&R) operation of generating layout data D14 from the netlist data D13 may be performed. Operation 520, that is, the P&R operation, may include operations 521, S22, and S23.

In operation 521, an operation of arranging the standard cells may be performed. For example, the semiconductor tool (e.g., a P&R tool) may arrange a plurality of standard cells from the netlist data D13 by referring to the standard cell library D12. The plurality of standard cells may be arranged in the first and second rows R1 and R2, as described with reference to FIG. 1. The plurality of standard cells may each occupy a different area. At least one of the plurality of standard cells may include a tapering portion or a reverse tapering portion, as shown in FIGS. 2A to 5C.

In operation S22, an operation of generating interconnections may be performed. An output pin and an input pin of a standard cell may be electrically connected to each other through the operation of generating interconnections. The standard cell may include at least one via.

In operation S23, an operation of generating the layout data D14 may be performed. The layout data D14 may include geometric information of cells and interconnections. The layout data D14 may have a format such as graphic design system II (GDSII).

In operation S30, a pattern on a mask may be determined by performing optical proximity correction (OPC) on the layout data D14. For example, a pattern having a desired shape may be formed by correcting a distortion phenomenon such as refraction caused by the characteristics of light in the layout data D14. In some embodiments, a layout of an IC may be limitedly modified in operation S30. Accordingly, the structure of the IC may be optimized. Operation S30 may be referred to as design polishing.

In operation 540, an operation of manufacturing a mask may be performed. At least one mask may be manufactured to form patterns determined in operation S30. The mask may include a photo mask.

In operation S50, an operation of fabricating an IC may be performed. For example, the IC may be fabricated by patterning a plurality of layers by using at least one mask manufactured in operation 540. As shown in FIG. 9, operation S50 may include operations S51 and S52.

In operation S51, a front-end-of-line (FEOL) operation may be performed. The FEOL operation may be referred to as an operation of forming individual devices on a substrate. The individual devices may include transistors, capacitors, resistors, or the like. The FEOL operation may include an operation of planarizing a wafer, an operation of cleaning the wafer, an operation of forming a trench, an operation of forming a well, an operation of forming a gate line, an operation of forming a source and a drain, or the like.

In operation S52, a back-end-of-line (BEOL) operation may be performed. The BEOL operation may be referred to as an operation interconnecting the individual devices. For example, the BEOL operation may include an operation of performing silicidation on gate, source, and drain regions, an operation of adding a dielectric, an operation of performing planarization, an operation of forming a hole, an operation of adding a metal layer, an operation of forming a via, an operation of forming a passivation layer, or the like.

After performing operation S52, a packaged IC may be used as a component in various applications.

Figure 10:
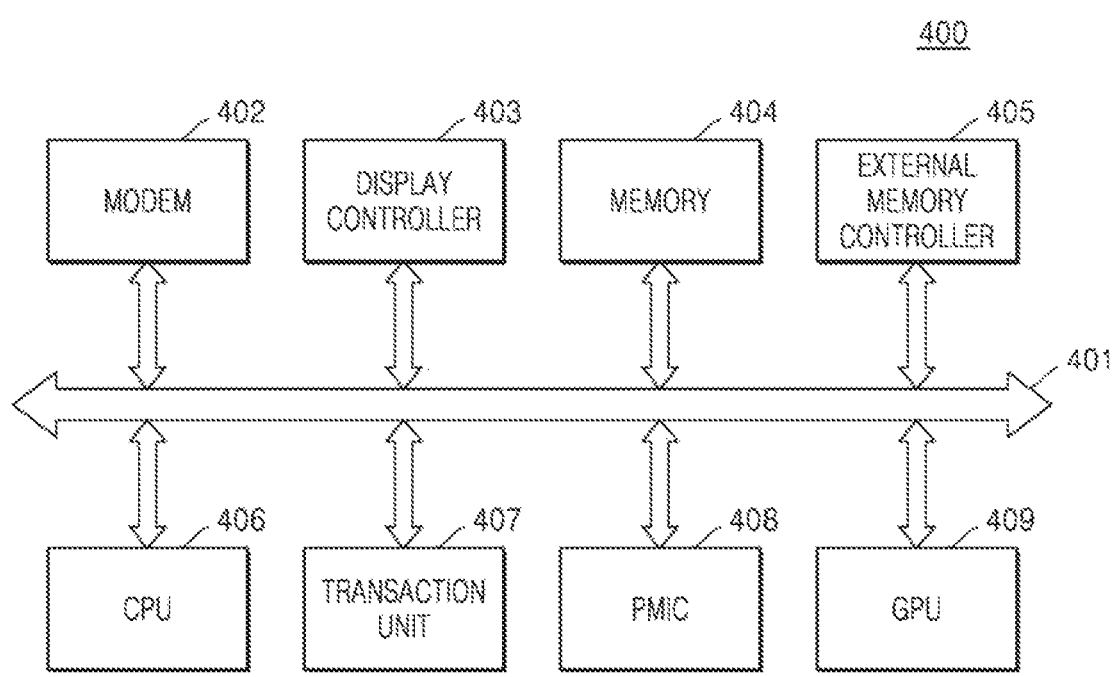
FIG. 10 is a block diagram of a system-on-chip (SoC), according to an example embodiment of the inventive concept.

FIG. 10 is a block diagram of a system-on-chip (SoC) 400 according to an example embodiment of the inventive concept. The SOC 400 is a semiconductor device, and may include an IC according to an example embodiment of the inventive concept. The SOC 400 implements, on a single chip, complex functional blocs such as intellectual property (IP) performing various functions, and active regions, standard cells, and power rails arranged according to an example embodiment of the inventive concept may be included in each of the functional blocks of the SOC 400.

Referring to FIG. 10, the SOC 400 may include a modem 402, a display controller 403, a memory 404, an external memory controller 405, a central processing unit (CPU) 406, a transaction unit 407, a power management IC (PMIC) 408, and a graphics processing unit (GPU) 409, and each functional block of the SOC 400 may communicate with each other through a system bus 401.

The CPU 406, which may control all operations of the SOC 400, may control operations of other functional blocks, such as the modem 402, the display controller 403, the memory 404, the external memory controller 405, the transaction unit 407, the PMIC 408, and the GPU 409. The modem 402 may demodulate a signal received from the outside of the SOC 400 or demodulate a signal generated inside the SOC 400, thereby transmitting the demodulated signal to the outside. The external memory controller 405 may control an operation of transmitting and receiving data to/from an external memory device connected to the SOC 400. For example, programs and/or data stored in the external memory device may be provided to the CPU 406 or the GPU 409 under the control of the external memory controller 405. The GPU 409 may execute program instructions related to graphics processing. The GPU 409 may receive graphic data through the external memory controller 405, and may transmit graphic data processed by the GPU 409 to the outside of the SOC 400 through the external memory controller 405. The transaction unit 407 may monitor data transactions of each functional block, and the PMIC 408 may control power supplied to each functional block according to the control of the transaction unit 407. The display controller 403 may transmit, to a display, data generated inside the SOC 400 by controlling the display (or a display device) outside the SOC 400.

The memory 404 may include, as non-volatile memory, electrically erasable programmable read-only memory (EEPROM), flash memory, phase change random access memory (PRAM), resistance random access memory (RRAM), nano floating gate memory (NFGM), polymer random access memory (PoRAM), magnetic random access memory (MRAM), ferroelectric random access memory (FRAM), or the like, and include, as volatile memory, dynamic random access memory (DRAM), static random access memory (SRAM), mobile DRAM, double data rate synchronous dynamic random access memory (DDRS-DRAM), low power DDR (LPDDR) SDRAM, graphic DDR (GDDR) SDRAM, rambus dynamic random access memory (RRAM), or the like.

Figure 11:
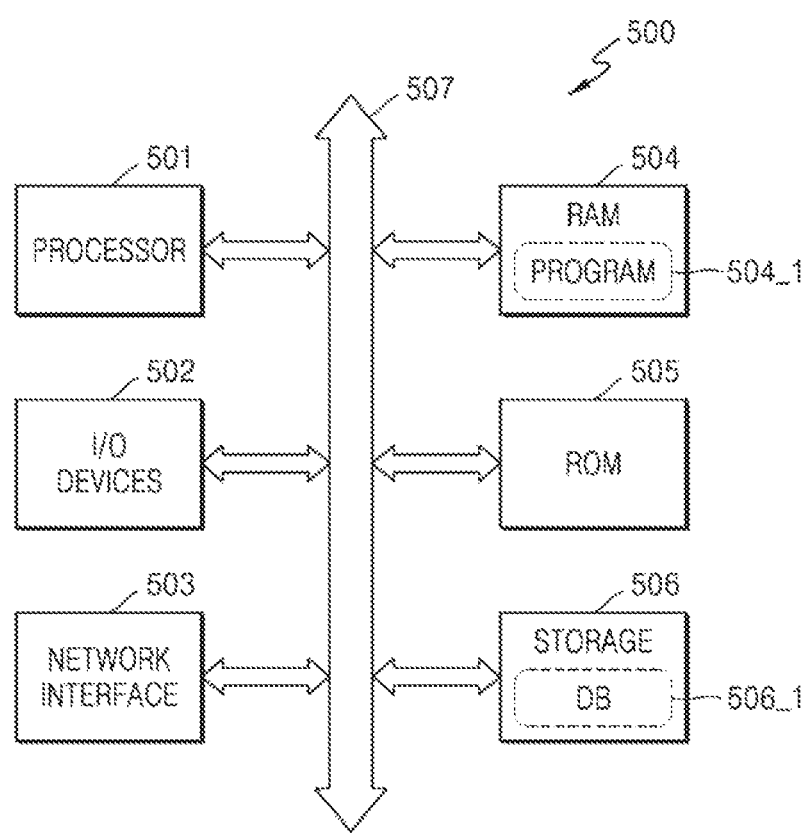
FIG. 11 is a block diagram of a computing system including a memory storing a program, according to an example embodiment of the inventive concept.

FIG. 11 is a block diagram of a computing system 500 including a memory storing a program according to an example embodiment of the inventive concept. At least some operations included in a method (e.g., the method of FIG. 9) of fabricating an IC according to example embodiments of the inventive concept may be performed in the computing system 500.

The computing system 500 may be a stationary computing system, such as a desktop computer, workstation, server, or the like, or a portable computing system, such as a laptop computer. As shown in FIG. 11, the computing system 500 may include a processor 501, input/output (I/O) devices 502, a network interface 503, a random access memory (RAM) 504, a read only memory (ROM) 505, and a storage device 506. The processor 501, the I/O devices 502, the network interface 503, the RAM 504, the ROM 505, and the storage device 506 may be connected to a bus 507, and may communicate with each other through the bus 507.

The processor 501 may be referred to as a processing unit, and may include at least one core capable of executing an arbitrary instruction set (e.g., Intel Architecture-32 (IA-32), 64 bit extension IA-32, x86-64, PowerPC, Sparc, MIPS, ARM, IA-64, or the like), for example, a micro processor, an application processor (AP), a digital signal processor (DSP), and a GPU. For example, the processor 501 may access a memory, for example, the RAM 504 or the ROM 505, through the bus 507, and may execute instructions stored in the RAM 504 or the ROM 505.

The RAM 504 may store a program 504_1 or at least a portion thereof for fabricating an IC according to an example embodiment of the inventive concept, and the program 504_1 may cause the processor 501 to perform at least some operations included in the method of fabricating an IC and operations included in a method of designing an IC. For example, the program 504_1 may include a plurality of instructions executable by the processor 501, and the plurality of instructions included in the program 504_1 may cause the processor 501 to perform, for example, at least some operations included in the flowchart described above with reference to FIG. 9.

The storage device 506 may not lose stored data even when power supplied to the computing system 500 is cut off. For example, the storage device 506 may include a non-volatile memory device, and may include a storage medium such as a magnetic tape, an optical disc, or a magnetic disc. In addition, the storage device 506 may be removable from the computing system 500. The storage device 506 may store the program 504_1 according to an example embodiment of the inventive concept, and before the program 504_1 is executed by the processor 501, the program 504_1 or at least a portion thereof may be loaded into the RAM 504 from the storage device 506. Alternatively, the storage device 506 may store a file written in a program language, and the program 504_1 or at least a portion thereof generated by a complier of the like may be loaded into the RAM 504 from the file. In addition, the storage device 506 may store a database 506_1, and the database 506_1 may include information required for designing an IC, for example, the standard cell library D12 of FIG. 9.

The storage device 506 may store data to be processed by the processor 501 or data processed by the processor 501. For example, the processor 501 may generate data by processing data stored in the storage device 506 according to the program 504_1, and may also store the generated data in the storage device 506. For example, the storage device 506 may store the RTL data D11, the netlist data D13, and/or the layout data D14 of FIG. 9.

The I/O devices 502 may include an input device such as a keyboard, a pointing device, or the like, and may include an output device such as a display device, a printer, or the like. For example, a user may trigger execution of the program 504_1 by the processor 501 through the I/O devices 502, input the RTL data D11 and/or the netlist data D13 of FIG. 9, and check the layout data D14 of FIG. 9.

The network interface 503 may provide access to a network outside the computing system 500. For example, the network may include multiple computing systems and communication links, and the communication links may include wired links, optical links, wireless links, or any other type of links.

While the inventive concept has been particularly shown and described with reference to embodiments thereof, it will be understood that various changes in form and details may be made therein without departing from the spirit and scope of the following claims.

What is claimed is:

1. An integrated circuit comprising:
a standard cell comprising a first active region extending in a first direction and having a first width; and
a filler cell comprising a second active region of a same type as that of the first active region and being adjacent to the standard cell in the first direction, the second active region extending in the first direction and having a second width which is greater than the first width,
wherein the standard cell further comprises a first tapering portion of the same type as that of the first active region, the first tapering portion being arranged between the first active region and the second active region and comprising a first contact surface contacting the first active region in the first direction, a second contact surface contacting the second active region in the first direction, and an inclination surface connecting the first contact surface to the second contact surface and having an inclination.

2. The integrated circuit of claim 1,
wherein the filler cell further comprises a third active region of a different type from that of the second active region, the third active region being spaced apart from the second active region in a second direction perpendicular to the first direction, extending in the first direction, and having the second width,
wherein the standard cell further comprises:
a fourth active region of a same type as that of the third active region, the fourth active region being spaced apart from the first active region in the second direction, extending in the first direction, and having the first width; and
a second tapering portion of the same type as that of the third active region, the second tapering portion being arranged between the third active region and the fourth active region and comprising a first surface contacting the fourth active region in the first direction, a second surface contacting the third active region in the first direction, and a third surface connecting the first surface to the second surface and having an inclination, and
wherein a distance between the first tapering portion and the second tapering portion decreases toward the filler cell.

3. The integrated circuit of claim 1,
wherein the filler cell further comprises a third active region of a different type from that of the second active region, the third active region being spaced apart from the second active region in a second direction perpendicular to the first direction, extending in the first active region, and having a third width which is less than the second width,
wherein the standard cell further comprises a fourth active region of a same type as that of the third active region, the fourth active region being spaced apart from the first active region in the second direction, extending in the first direction, and having the third width, and
wherein a distance between the fourth active region and the first tapering portion decreases toward the filler cell.

4. The integrated circuit of claim 3, wherein the third width is the same as the first width.

5. The integrated circuit of claim 1,
wherein the filler cell further comprises a third active region of a different type from that of the second active region, the third active region being spaced apart from the second active region in a second direction perpendicular to the first direction, extending in the first active region, and having the second width,
wherein the standard cell further comprises:
a fourth active region of a same type as that of the third active region, the fourth active region being spaced apart from the first active region in the second direction, extending in the first direction, and having the first width; and
a second tapering portion of the same type as that of the third active region, the second tapering portion being arranged between the third active region and the fourth active region and comprising a first surface contacting the fourth active region in the first direction, a second surface contacting the third active region in the first direction, and a third surface connecting the first surface to the second surface and having an inclination, and
wherein a distance between the first tapering portion and the second tapering portion is constant.

6. The integrated circuit of claim 1,
wherein the filler cell further comprises a third active region of a different type from that of the second active region, the third active region being spaced apart from the second active region in a second direction perpendicular to the first direction, extending in the first active region, and having a third width which is less than the second width,
wherein the standard cell further comprises a fourth active region of a same type as that of the third active region, the fourth active region being spaced apart from the first active region in the second direction, extending in the first direction, and having the third width, and
wherein a distance between the fourth active region and the first tapering portion is constant.

7. The integrated circuit of claim 6, wherein the third width is the same as the first width.

8. The integrated circuit of claim 1, wherein the inclination surface comprises a straight line or a curved line.

9. The integrated circuit of claim 1, wherein the filler cell further comprises a contact connected to the second active region.

10. The integrated circuit of claim 1, wherein the standard cell further comprises a gate-all-around transistor formed in the first active region.

11. An integrated circuit comprising:
a standard cell comprising a first active region extending in a first direction and having a first width; and
a filler cell comprising a second active region of a same type as that of the first active region and being adjacent to the standard cell in the first direction, the second active region extending in the first direction and having a second width which is less than the first width,
wherein the standard cell further comprises a first reverse tapering portion of the same type as that of the first active region, the first reverse tapering portion being arranged between the first active region and the second active region and comprising a first contact surface contacting the first active region in the first direction, a second contact surface contacting the second active region in the first direction, and an inclination surface connecting the first contact surface to the second contact surface and having an inclination.

12. The integrated circuit of claim 11,
wherein the filler cell further comprises a third active region of a different type from that of the second active region, the third active region being spaced apart from the second active region in a second direction perpendicular to the first direction, extending in the first direction, and having the second width,
wherein the standard cell further comprises:
a fourth active region of the same type as that of the third active region, the fourth active region being spaced apart from the first active region in the second direction, extending in the first direction, and having the first width; and
a second reverse tapering portion of the same type as that of the third active region, the second reverse tapering portion being arranged between the third active region and the fourth active region and comprising a first surface contacting the fourth active region in the first direction, a second surface contacting the third active region in the first direction, and a third surface connecting the first surface to the second surface and having an inclination, and
wherein a distance between the first reverse tapering portion and the second reverse tapering portion increases toward the filler cell.

13. The integrated circuit of claim 11,
wherein the filler cell further comprises a third active region of a different type from that of the second active region, the third active region being spaced apart from the second active region in a second direction perpendicular to the first direction, extending in the first active region, and having a third width which is less than the first width,
wherein the standard cell further comprises a fourth active region of a same type as that of the third active region, the fourth active region being spaced apart from the first active region in the second direction, extending in the first direction, and having the third width, and
wherein a distance between the fourth active region and the first reverse tapering portion increases toward the filler cell.

14. The integrated circuit of claim 13, wherein the third width is the same as the second width.

15. The integrated circuit of claim 11,
wherein the filler cell further comprises a third active region of a different type from that of the second active region, the third active region being spaced apart from the second active region in a second direction perpendicular to the first direction, extending in the first direction, and having the second width, wherein the standard cell further comprises:
- a fourth active region of a same type as that of the third active region, the fourth active region being spaced apart from the first active region in the second direction, extending in the first direction, and having the first width; and
- a second reverse tapering portion of the same type as that of the third active region, the second reverse tapering portion being arranged between the third active region and the fourth active region and comprising a first surface contacting the fourth active region in the first direction, a second surface contacting the third active region in the first direction, and a third surface connecting the first surface to the second surface and having an inclination, and wherein a distance between the first reverse tapering portion and the second reverse tapering portion is constant.

16. The integrated circuit of claim 11,
wherein the filler cell further comprises a third active region of a different type from that of the second active region, the third active region being spaced apart from the second active region in a second direction perpendicular to the first direction, extending in the first active region, and having a third width which is less than the first width, wherein the standard cell further comprises a fourth active region of the same type as that of the third active region, the fourth active region being spaced apart from the first active region in the second direction, extending in the first direction, and having the third width, and wherein a distance between the fourth active region and the first reverse tapering portion is constant.

17. The integrated circuit of claim 16, wherein the third width is the same as the second width.

18. The integrated circuit of claim 11, wherein the inclination surface comprises a straight line or a curved line.

19. The integrated circuit of claim 11, wherein the filler cell further comprises a contact formed on the second active region.

20. The integrated circuit of claim 11, wherein the standard cell further comprises a gate-all-around transistor formed in the first active region.

* * * * *